United States Patent [19]
Fukuda

[11] Patent Number: 5,644,307
[45] Date of Patent: Jul. 1, 1997

[54] MODULATION METHOD, RECORDING METHOD, REPRODUCING METHOD, RECORDING AND REPRODUCING APPARATUS, RECORDING AND REPRODUCING METHOD, AND REPRODUCING APPARATUS

[75] Inventor: Shinichi Fukuda, Kanagawa, Japan

[73] Assignee: Sony Corporation, Tokyo, Japan

[21] Appl. No.: 401,909

[22] Filed: Mar. 10, 1995

[30] Foreign Application Priority Data

Mar. 14, 1994 [JP] Japan ................................. 6-042208

[51] Int. Cl.$^6$ ................................................. H03M 7/30
[52] U.S. Cl. ........................ 341/68; 341/50; 341/95; 371/43
[58] Field of Search ........................... 341/95, 50, 68, 341/67; 371/43; 375/262

[56] References Cited

U.S. PATENT DOCUMENTS

| | | | |
|---|---|---|---|
| 4,456,905 | 6/1984 | Odaka | 340/347 |
| 4,546,393 | 10/1985 | Mori et al. | 360/40 |
| 4,626,826 | 12/1986 | Fukuda et al. | 340/347 |
| 4,731,678 | 3/1988 | Takeuchi | 360/40 |
| 4,833,470 | 5/1989 | Iketani | 341/59 |
| 5,192,949 | 3/1993 | Suzuki et al. | 341/68 |
| 5,440,572 | 8/1995 | Kitaori | 371/43 |

FOREIGN PATENT DOCUMENTS

| | | | |
|---|---|---|---|
| 0193153 | 9/1986 | European Pat. Off. | G11B 20/14 |
| 4217309 | 12/1993 | Germany | H03M 13/02 |

*Primary Examiner*—Jeffrey A. Gaffin
*Assistant Examiner*—Peguy JeanPierre
*Attorney, Agent, or Firm*—Jay H. Maioli

[57] ABSTRACT

A modulation method is for transforming data to a code using a code having CDS after NRZI modulation equal to 0, ±2 of (0,3;8,10;1) code, the method comprising the step of transforming 8-bit data to a 10-bit code, using a code other than a code such that lengths between transition 1T, 4T, 1T, 3T, 1T, or 1T, 3T, 1T, 4T, 1T, with T denoting the minimum length between transition, are generated in a waveform string corresponding to continuation of two identical codes, the waveform string being produced by NRZI modulating a code series of continuous codes, with the number of continuous 1's being not greater than N, with N being 12 to 18, in the code series.

15 Claims, 23 Drawing Sheets

| DATA | | CODE | | | | | |
|---|---|---|---|---|---|---|---|
| | | Q'=-1 | | | Q'=1 | | |
| Hex | Binary | CODE | DC | Q | CODE | DC | Q |
| 00 | 00000000 | 0101010101 | 0 | 1 | 0101010101 | 0 | -1 |
| 01 | 00000001 | 0101010111 | 0 | -1 | 0101010111 | 0 | -1 |
| 02 | 00000010 | 0101011101 | 0 | -1 | 0101011101 | 0 | 1 |
| 03 | 00000011 | 0101011111 | 0 | 1 | 0101011111 | 0 | -1 |
| 04 | 00000100 | 0101001001 | 0 | -1 | 0101001001 | 0 | 1 |
| 05 | 00000101 | 0101001011 | 0 | 1 | 0101001011 | 0 | -1 |
| 06 | 00000110 | 0101001110 | 0 | 1 | 0101001110 | 0 | -1 |
| 07 | 00000111 | 0101011010 | 0 | 1 | 0101011010 | 0 | -1 |
| 08 | 00001000 | 0101110101 | 0 | -1 | 0101110101 | 0 | 1 |
| 09 | 00001001 | 0101110111 | 0 | 1 | 0101110111 | 0 | -1 |
| 0A | 00001010 | 0101111101 | 0 | 1 | 0101111101 | 0 | -1 |
| 0B | 00001011 | 0101111111 | 0 | -1 | 0101111111 | 0 | 1 |
| 0C | 00001100 | 0101101001 | 0 | 1 | 0101101001 | 0 | -1 |
| 0D | 00001101 | 0101101011 | 0 | -1 | 0101101011 | 0 | 1 |
| 0E | 00001110 | 0101101110 | 0 | -1 | 0101101110 | 0 | 1 |
| 0F | 00001111 | 0101111010 | 0 | -1 | 0101111010 | 0 | 1 |
| 10 | 00010000 | 1101010010 | 0 | 1 | 1101010010 | 0 | -1 |
| 11 | 00010001 | 0100010010 | 2 | -1 | 1100010010 | -2 | -1 |
| 12 | 00010010 | 0101010010 | 0 | -1 | 0101010010 | 0 | 1 |
| 13 | 00010011 | 0101110010 | 0 | 1 | 0101110010 | 0 | -1 |
| 14 | 00010100 | 1101110001 | 2 | 1 | 0101110001 | -2 | 1 |
| 15 | 00010101 | 1101110011 | 2 | -1 | 0101110011 | -2 | -1 |
| 16 | 00010110 | 1101110110 | 2 | -1 | 0101110110 | -2 | -1 |
| 17 | 00010111 | 1101110010 | 0 | -1 | 1101110010 | 0 | 1 |
| 18 | 00011000 | 0101100101 | 2 | -1 | 1101100101 | -2 | -1 |
| 19 | 00011001 | 0101100111 | 2 | 1 | 1101100111 | -2 | 1 |
| 1A | 00011010 | 0101101101 | 2 | 1 | 1101101101 | -2 | 1 |
| 1B | 00011011 | 0101101111 | 2 | -1 | 1101101111 | -2 | -1 |
| 1C | 00011100 | 0101111001 | 2 | 1 | 1101111001 | -2 | 1 |
| 1D | 00011101 | 0101111011 | 2 | -1 | 1101111011 | -2 | -1 |
| 1E | 00011110 | 0101111110 | 2 | -1 | 1101111110 | -2 | -1 |
| 1F | 00011111 | 0101101010 | 2 | -1 | 1101101010 | -2 | -1 |
| 20 | 00100000 | 0111010101 | 0 | -1 | 0111010101 | 0 | 1 |
| 21 | 00100001 | 0111010111 | 0 | 1 | 0111010111 | 0 | -1 |
| 22 | 00100010 | 0111011101 | 0 | 1 | 0111011101 | 0 | -1 |
| 23 | 00100011 | 0111011111 | 0 | -1 | 0111011111 | 0 | 1 |
| 24 | 00100100 | 1111010001 | 2 | 1 | 0111010001 | -2 | 1 |
| 25 | 00100101 | 1111010011 | 2 | -1 | 0111010011 | -2 | -1 |
| 26 | 00100110 | 1111010110 | 2 | -1 | 0111010110 | -2 | -1 |
| 27 | 00100111 | 0111011010 | 0 | -1 | 0111011010 | 0 | 1 |

FIG.1

| DATA | | CODE | | | | | |
|---|---|---|---|---|---|---|---|
| | | Q'= -1 | | | Q'=1 | | |
| Hex | Binary | CODE | DC | Q | CODE | DC | Q |
| 28 | 00101000 | 0111110101 | 0 | 1 | 0111110101 | 0 | -1 |
| 29 | 00101001 | 0111110111 | 0 | -1 | 0111110111 | 0 | 1 |
| 2A | 00101010 | 0111111101 | 0 | -1 | 0111111101 | 0 | 1 |
| 2B | 00101011 | 0111111111 | 0 | 1 | 0111111111 | 0 | -1 |
| 2C | 00101100 | 0111101001 | 0 | -1 | 0111101001 | 0 | 1 |
| 2D | 00101101 | 0111101011 | 0 | 1 | 0111101011 | 0 | -1 |
| 2E | 00101110 | 0111101110 | 0 | 1 | 0111101110 | 0 | -1 |
| 2F | 00101111 | 0111111010 | 0 | 1 | 0111111010 | 0 | -1 |
| 30 | 00110000 | 0111010010 | 0 | 1 | 0111010010 | 0 | -1 |
| 31 | 00110001 | 1110010010 | 2 | -1 | 0100010010 | -2 | -1 |
| 32 | 00110010 | 1111010010 | 0 | -1 | 1111010010 | 0 | 1 |
| 33 | 00110011 | 1111110010 | 0 | 1 | 1111110010 | 0 | -1 |
| 34 | 00110100 | 0111110001 | 2 | 1 | 1111110001 | -2 | 1 |
| 35 | 00110101 | 0111110011 | 2 | -1 | 1111110011 | -2 | -1 |
| 36 | 00110110 | 0111110110 | 2 | -1 | 1111110110 | -2 | -1 |
| 37 | 00110111 | 0111110010 | 0 | -1 | 0111110010 | 0 | 1 |
| 38 | 00111000 | 0111000101 | 2 | -1 | 1111000101 | -2 | -1 |
| 39 | 00111001 | 0111000111 | 2 | 1 | 1111000111 | -2 | 1 |
| 3A | 00111010 | 0111001101 | 2 | 1 | 1111001101 | -2 | 1 |
| 3B | 00111011 | 0111001111 | 2 | -1 | 1111001111 | -2 | -1 |
| 3C | 00111100 | 0111011001 | 2 | 1 | 1111011001 | -2 | 1 |
| 3D | 00111101 | 0111011011 | 2 | -1 | 1111011001 | -2 | -1 |
| 3E | 00111110 | 0111011110 | 2 | -1 | 1111011110 | -2 | -1 |
| 3F | 00111111 | 0111001010 | 2 | -1 | 1111001010 | -2 | -1 |
| 40 | 01000000 | 0100010101 | 2 | 1 | 1100010101 | -2 | 1 |
| 41 | 01000001 | 0100010111 | 2 | -1 | 1100010111 | -2 | -1 |
| 42 | 01000010 | 0100011101 | 2 | -1 | 1100011101 | -2 | -1 |
| 43 | 01000011 | 0100011111 | 2 | 1 | 1100011111 | -2 | 1 |
| 44 | 01000100 | 0101010001 | 2 | 1 | 1101010001 | -2 | 1 |
| 45 | 01000101 | 0101010011 | 2 | -1 | 1101010011 | -2 | -1 |
| 46 | 01000110 | 0101010110 | 2 | -1 | 1101010110 | -2 | -1 |
| 47 | 01000111 | 0100011010 | 2 | 1 | 1100011010 | -2 | 1 |
| 48 | 01001000 | 0100110101 | 2 | -1 | 1100110101 | -2 | -1 |
| 49 | 01001001 | 0100110111 | 2 | 1 | 1100110111 | -2 | 1 |
| 4A | 01001010 | 0100111101 | 2 | 1 | 1100111101 | -2 | 1 |
| 4B | 01001011 | 0100111111 | 2 | -1 | 1100111111 | -2 | -1 |
| 4C | 01001100 | 0100101001 | 2 | 1 | 1100101001 | -2 | 1 |
| 4D | 01001101 | 0100101011 | 2 | -1 | 1100101011 | -2 | -1 |
| 4E | 01001110 | 0100101110 | 2 | -1 | 1100101110 | -2 | -1 |
| 4F | 01001111 | 0100111010 | 2 | -1 | 1100111010 | -2 | -1 |

FIG.2

| DATA | | CODE | | | | | |
|---|---|---|---|---|---|---|---|
| | | Q'= -1 | | | Q'=1 | | |
| Hex | Binary | CODE | DC | Q | CODE | DC | Q |
| 50 | 01010000 | 0100100101 | 0 | -1 | 0100100101 | 0 | 1 |
| 51 | 01010001 | 0100100111 | 0 | 1 | 0100100111 | 0 | -1 |
| 52 | 01010010 | 0100101101 | 0 | 1 | 0100101101 | 0 | -1 |
| 53 | 01010011 | 0100101111 | 0 | -1 | 0100101111 | 0 | 1 |
| 54 | 01010100 | 0100111001 | 0 | 1 | 0100111001 | 0 | -1 |
| 55 | 01010101 | 0100111011 | 0 | -1 | 0100111011 | 0 | 1 |
| 56 | 01010110 | 0100111110 | 0 | -1 | 0100111110 | 0 | 1 |
| 57 | 01010111 | 0100101010 | 0 | -1 | 0100101010 | 0 | 1 |
| 58 | 01011000 | 0110100101 | 0 | 1 | 0110100101 | 0 | -1 |
| 59 | 01011001 | 0110100111 | 0 | -1 | 0110100111 | 0 | 1 |
| 5A | 01011010 | 0110101101 | 0 | -1 | 0110101101 | 0 | 1 |
| 5B | 01011011 | 0110101111 | 0 | 1 | 0110101111 | 0 | -1 |
| 5C | 01011100 | 0110111001 | 0 | -1 | 0110111001 | 0 | 1 |
| 5D | 01011101 | 0110111011 | 0 | 1 | 0110111011 | 0 | -1 |
| 5E | 01011110 | 0110111110 | 0 | 1 | 0110111110 | 0 | -1 |
| 5F | 01011111 | 0110101010 | 0 | 1 | 0110101010 | 0 | -1 |
| 60 | 01100000 | 0010010101 | 0 | -1 | 0010010101 | 0 | 1 |
| 61 | 01100001 | 0010010111 | 0 | 1 | 0010010111 | 0 | -1 |
| 62 | 01100010 | 0010011101 | 0 | 1 | 0010011101 | 0 | -1 |
| 63 | 01100011 | 0010011111 | 0 | -1 | 0010011111 | 0 | 1 |
| 64 | 01100100 | 1010010001 | 2 | 1 | 0010010001 | -2 | 1 |
| 65 | 01100101 | 1010010011 | 2 | -1 | 0010010011 | -2 | -1 |
| 66 | 01100110 | 1010010110 | 2 | -1 | 0010010110 | -2 | -1 |
| 67 | 01100111 | 0010011010 | 0 | -1 | 0010011010 | 0 | 1 |
| 68 | 01101000 | 0010110101 | 0 | 1 | 0010110101 | 0 | -1 |
| 69 | 01101001 | 0010110111 | 0 | -1 | 0010110111 | 0 | 1 |
| 6A | 01101010 | 0010111101 | 0 | -1 | 0010111101 | 0 | 1 |
| 6B | 01101011 | 0010111111 | 0 | 1 | 0010111111 | 0 | -1 |
| 6C | 01101100 | 0010101001 | 0 | -1 | 0010101001 | 0 | 1 |
| 6D | 01101101 | 0010101011 | 0 | 1 | 0010101011 | 0 | -1 |
| 6E | 01101110 | 0010101110 | 0 | 1 | 0010101110 | 0 | -1 |
| 6F | 01101111 | 0010111010 | 0 | 1 | 0010111010 | 0 | -1 |
| 70 | 01110000 | 0010010010 | 0 | 1 | 0010010010 | 0 | -1 |
| 71 | 01110001 | 1011010010 | 2 | -1 | 0011010010 | -2 | -1 |
| 72 | 01110010 | 1010010010 | 0 | -1 | 1010010010 | 0 | 1 |
| 73 | 01110011 | 1010110010 | 0 | 1 | 1010110010 | 0 | -1 |
| 74 | 01110100 | 0010110001 | 2 | 1 | 1010110001 | -2 | 1 |
| 75 | 01110101 | 0010110011 | 2 | -1 | 1010110011 | -2 | -1 |
| 76 | 01110110 | 0010110110 | 2 | -1 | 1010110110 | -2 | -1 |
| 77 | 01110111 | 0010110010 | 0 | -1 | 0010110010 | 0 | 1 |

FIG.3

| DATA | | CODE | | | | | |
|---|---|---|---|---|---|---|---|
| | | Q'= -1 | | | Q'=1 | | |
| Hex | Binary | CODE | DC | Q | CODE | DC | Q |
| 78 | 01111000 | 0011100101 | 0 | 1 | 0011100101 | 0 | -1 |
| 79 | 01111001 | 0011100111 | 0 | -1 | 0011100111 | 0 | 1 |
| 7A | 01111010 | 0011101101 | 0 | -1 | 0011101101 | 0 | 1 |
| 7B | 01111011 | 0011101111 | 0 | 1 | 0011101111 | 0 | -1 |
| 7C | 01111100 | 0011111001 | 0 | -1 | 0011111001 | 0 | 1 |
| 7D | 01111101 | 0011111011 | 0 | 1 | 0011111011 | 0 | -1 |
| 7E | 01111110 | 0011111110 | 0 | 1 | 0011111110 | 0 | -1 |
| 7F | 01111111 | 0011101010 | 0 | 1 | 0011101010 | 0 | -1 |
| 80 | 10000000 | 1010010101 | 0 | 1 | 1010010101 | 0 | -1 |
| 81 | 10000001 | 1010010111 | 0 | -1 | 1010010111 | 0 | 1 |
| 82 | 10000010 | 1010011101 | 0 | -1 | 1010011101 | 0 | 1 |
| 83 | 10000011 | 1010011111 | 0 | 1 | 1010011111 | 0 | -1 |
| 84 | 10000100 | 1010001001 | 0 | -1 | 1010001001 | 0 | 1 |
| 85 | 10000101 | 1010001011 | 0 | 1 | 1010001011 | 0 | -1 |
| 86 | 10000110 | 1010001110 | 0 | 1 | 1010001110 | 0 | -1 |
| 87 | 10000111 | 1010011010 | 0 | 1 | 1010011010 | 0 | -1 |
| 88 | 10001000 | 1010110101 | 0 | -1 | 1010110101 | 0 | 1 |
| 89 | 10001001 | 1010110111 | 0 | 1 | 1010110111 | 0 | -1 |
| 8A | 10001010 | 1010111101 | 0 | 1 | 1010111101 | 0 | -1 |
| 8B | 10001011 | 1010111111 | 0 | -1 | 1010000000 | 0 | 1 |
| 8C | 10001100 | 1010101001 | 0 | 1 | 1010101001 | 0 | -1 |
| 8D | 10001101 | 1010101011 | 0 | -1 | 1010101011 | 0 | 1 |
| 8E | 10001110 | 1010101110 | 0 | -1 | 1010101110 | 0 | 1 |
| 8F | 10001111 | 1010111010 | 0 | -1 | 1010111010 | 0 | 1 |
| 90 | 10010000 | 1100100101 | 0 | 1 | 1100100101 | 0 | -1 |
| 91 | 10010001 | 1100100111 | 0 | -1 | 1100100111 | 0 | 1 |
| 92 | 10010010 | 1100101101 | 0 | -1 | 1100101101 | 0 | 1 |
| 93 | 10010011 | 1100101111 | 0 | 1 | 1100101111 | 0 | -1 |
| 94 | 10010100 | 1100111001 | 0 | -1 | 1100111001 | 0 | 1 |
| 95 | 10010101 | 1100111011 | 0 | 1 | 1100111011 | 0 | -1 |
| 96 | 10010110 | 1100111110 | 0 | 1 | 1100111110 | 0 | -1 |
| 97 | 10010111 | 1100101010 | 0 | 1 | 1100101010 | 0 | -1 |
| 98 | 10011000 | 1010100101 | 2 | -1 | 0010100101 | -2 | -1 |
| 99 | 10011001 | 1010100111 | 2 | 1 | 0010100111 | -2 | 1 |
| 9A | 10011010 | 1010101101 | 2 | 1 | 0010101101 | -2 | 1 |
| 9B | 10011011 | 1010101111 | 2 | -1 | 0010101111 | -2 | -1 |
| 9C | 10011100 | 1010111001 | 2 | 1 | 0010111001 | -2 | 1 |
| 9D | 10011101 | 1010111011 | 2 | -1 | 0010111011 | -2 | -1 |
| 9E | 10011110 | 1010111110 | 2 | -1 | 0010111110 | -2 | -1 |
| 9F | 10011111 | 1010101010 | 2 | -1 | 0010101010 | -2 | -1 |

FIG.4

| DATA | | CODE | | | | | |
|---|---|---|---|---|---|---|---|
| | | Q'=-1 | | | Q'=1 | | |
| Hex | Binary | CODE | DC | Q | CODE | DC | Q |
| A0 | 10100000 | 1011010101 | 2 | 1 | 0011010101 | -2 | 1 |
| A1 | 10100001 | 1011010111 | 2 | -1 | 0011010111 | -2 | -1 |
| A2 | 10100010 | 1011011101 | 2 | -1 | 0011011101 | -2 | -1 |
| A3 | 10100011 | 1011011111 | 2 | 1 | 0011011111 | -2 | 1 |
| A4 | 10100100 | 1011001001 | 2 | -1 | 0011001001 | -2 | -1 |
| A5 | 10100101 | 1011001011 | 2 | 1 | 0011001011 | -2 | 1 |
| A6 | 10100110 | 1011001110 | 2 | 1 | 0011001110 | -2 | 1 |
| A7 | 10100111 | 1011011010 | 2 | 1 | 0011011010 | -2 | 1 |
| A8 | 10101000 | 1011110101 | 2 | -1 | 0011110101 | -2 | -1 |
| A9 | 10101001 | 1011110111 | 2 | 1 | 0011110111 | -2 | 1 |
| AA | 10101010 | 1011111101 | 2 | 1 | 0011111101 | -2 | 1 |
| AB | 10101011 | 1011111111 | 2 | -1 | 0011111111 | -2 | -1 |
| AC | 10101100 | 1011101001 | 2 | 1 | 0011101001 | -2 | 1 |
| AD | 10101101 | 1011101011 | 2 | -1 | 0011101011 | -2 | -1 |
| AE | 10101110 | 1011101110 | 2 | -1 | 0011101110 | -2 | -1 |
| AF | 10101111 | 1011111010 | 2 | -1 | 0011111010 | -2 | -1 |
| B0 | 10110000 | 1101110101 | 0 | 1 | 1101110101 | 0 | -1 |
| B1 | 10110001 | 1101110111 | 0 | -1 | 1101110111 | 0 | 1 |
| B2 | 10110010 | 1101111101 | 0 | -1 | 1101111101 | 0 | 1 |
| B3 | 10110011 | 1101111111 | 0 | 1 | 1101111111 | 0 | -1 |
| B4 | 10110100 | 1101101001 | 0 | -1 | 1101101001 | 0 | 1 |
| B5 | 10110101 | 1101101011 | 0 | 1 | 1101101011 | 0 | -1 |
| B6 | 10110110 | 1101101110 | 0 | 1 | 1101101110 | 0 | -1 |
| B7 | 10110111 | 1101111010 | 0 | 1 | 1101111010 | 0 | -1 |
| B8 | 10111000 | 1011100101 | 0 | -1 | 1011100101 | 0 | 1 |
| B9 | 10111001 | 1011100111 | 0 | 1 | 1011100111 | 0 | -1 |
| BA | 10111010 | 1011101101 | 0 | 1 | 1011101101 | 0 | -1 |
| BB | 10111011 | 1011101111 | 0 | -1 | 1011101111 | 0 | 1 |
| BC | 10111100 | 1011111001 | 0 | 1 | 1011111001 | 0 | -1 |
| BD | 10111101 | 1011111011 | 0 | -1 | 1011111011 | 0 | 1 |
| BE | 10111110 | 1011111110 | 0 | -1 | 1011111110 | 0 | 1 |
| BF | 10111111 | 1011101010 | 0 | -1 | 1011101010 | 0 | 1 |
| C0 | 11000000 | 1110010101 | 2 | 1 | 0110010101 | -2 | 1 |
| C1 | 11000001 | 1110010111 | 2 | -1 | 0110010111 | -2 | -1 |
| C2 | 11000010 | 1110011101 | 2 | -1 | 0110011101 | -2 | -1 |
| C3 | 11000011 | 1110011111 | 2 | 1 | 0110011111 | -2 | 1 |
| C4 | 11000100 | 1110001001 | 2 | -1 | 0110001001 | -2 | -1 |
| C5 | 11000101 | 1110001011 | 2 | 1 | 0110001011 | -2 | 1 |
| C6 | 11000110 | 1110001110 | 2 | 1 | 0110001110 | -2 | 1 |
| C7 | 11000111 | 1110011010 | 2 | 1 | 0110011010 | -2 | 1 |

FIG.5

| DATA | | CODE | | | | | |
|---|---|---|---|---|---|---|---|
| | | Q'=-1 | | | Q'=1 | | |
| Hex | Binary | CODE | DC | Q | CODE | DC | Q |
| C8 | 11001000 | 1110110101 | 2 | -1 | 0110110101 | -2 | -1 |
| C9 | 11001001 | 1110110111 | 2 | 1 | 0110110111 | -2 | 1 |
| CA | 11001010 | 1110111101 | 2 | 1 | 0110111101 | -2 | 1 |
| CB | 11001011 | 1110111111 | 2 | -1 | 0110111111 | -2 | -1 |
| CC | 11001100 | 1110101001 | 2 | 1 | 0110101001 | -2 | 1 |
| CD | 11001101 | 1110101011 | 2 | -1 | 0110101011 | -2 | -1 |
| CE | 11001110 | 1110101110 | 2 | -1 | 0110101110 | -2 | -1 |
| CF | 11001111 | 1110111010 | 2 | -1 | 0110111010 | -2 | -1 |
| D0 | 11010000 | 1101000101 | 2 | -1 | 0101000101 | -2 | -1 |
| D1 | 11010001 | 1101000111 | 2 | 1 | 0101000111 | -2 | 1 |
| D2 | 11010010 | 1101001101 | 2 | 1 | 0101001101 | -2 | 1 |
| D3 | 11010011 | 1101001111 | 2 | -1 | 0101001111 | -2 | -1 |
| D4 | 11010100 | 1101011001 | 2 | 1 | 0101011001 | -2 | 1 |
| D5 | 11010101 | 1101011011 | 2 | -1 | 0101011011 | -2 | -1 |
| D6 | 11010110 | 1101011110 | 2 | -1 | 0101011110 | -2 | -1 |
| D7 | 11010111 | 1101001010 | 2 | -1 | 0101001010 | -2 | -1 |
| D8 | 11011000 | 1110100101 | 0 | -1 | 1110100101 | 0 | 1 |
| D9 | 11011001 | 1110100111 | 0 | 1 | 1110100111 | 0 | -1 |
| DA | 11011010 | 1110101101 | 0 | 1 | 1110101101 | 0 | -1 |
| DB | 11011011 | 1110101111 | 0 | -1 | 1110101111 | 0 | 1 |
| DC | 11011100 | 1110111001 | 0 | 1 | 1110111001 | 0 | -1 |
| DD | 11011101 | 1110111011 | 0 | -1 | 1110111011 | 0 | 1 |
| DE | 11011110 | 1110111110 | 0 | -1 | 1110111110 | 0 | 1 |
| DF | 11011111 | 1110101010 | 0 | -1 | 1110101010 | 0 | 1 |
| E0 | 11100000 | 1111010101 | 0 | 1 | 1111010101 | 0 | -1 |
| E1 | 11100001 | 1111010111 | 0 | -1 | 1111010111 | 0 | 1 |
| E2 | 11100010 | 1111011101 | 0 | -1 | 1111011101 | 0 | 1 |
| E3 | 11100011 | 1111011111 | 0 | 1 | 1111011111 | 0 | -1 |
| E4 | 11100100 | 1111001001 | 0 | -1 | 1111001001 | 0 | 1 |
| E5 | 11100101 | 1111001011 | 0 | 1 | 1111001011 | 0 | -1 |
| E6 | 11100110 | 1111001110 | 0 | 1 | 1111001110 | 0 | -1 |
| E7 | 11100111 | 1111011010 | 0 | 1 | 1111011010 | 0 | -1 |
| E8 | 11101000 | 1111110101 | 0 | -1 | 1111110101 | 0 | 1 |
| E9 | 11101001 | 1111110111 | 0 | 1 | 1111110111 | 0 | -1 |
| EA | 11101010 | 1111111101 | 0 | 1 | 1111111101 | 0 | -1 |
| EB | 11101011 | 1111111111 | 0 | -1 | 1111111111 | 0 | 1 |
| EC | 11101100 | 1111101001 | 0 | 1 | 1111101001 | 0 | -1 |
| ED | 11101101 | 1111101011 | 0 | -1 | 1111101011 | 0 | 1 |
| EE | 11101110 | 1111101110 | 0 | -1 | 1111101110 | 0 | 1 |
| EF | 11101111 | 1111111010 | 0 | -1 | 1111111010 | 0 | 1 |

FIG.6

| DATA | | CODE | | | | | |
|---|---|---|---|---|---|---|---|
| | | Q'= -1 | | | Q'=1 | | |
| Hex | Binary | CODE | DC | Q | CODE | DC | Q |
| F0 | 11110000 | 1101010101 | 0 | -1 | 1101010101 | 0 | 1 |
| F1 | 11110001 | 1101010111 | 0 | 1 | 1101010111 | 0 | -1 |
| F2 | 11110010 | 1101011101 | 0 | 1 | 1101011101 | 0 | -1 |
| F3 | 11110011 | 1101011111 | 0 | -1 | 1101011111 | 0 | 1 |
| F4 | 11110100 | 1101001001 | 0 | 1 | 1101001001 | 0 | -1 |
| F5 | 11110101 | 1101001011 | 0 | -1 | 1101001011 | 0 | 1 |
| F6 | 11110110 | 1101001110 | 0 | -1 | 1101001110 | 0 | 1 |
| F7 | 11110111 | 1101011010 | 0 | -1 | 1101011010 | 0 | 1 |
| F8 | 11111000 | 1111100101 | 2 | -1 | 0111100101 | -2 | -1 |
| F9 | 11111001 | 1111100111 | 2 | 1 | 0111100111 | -2 | 1 |
| FA | 11111010 | 1111101101 | 2 | 1 | 0111101101 | -2 | 1 |
| FB | 11111011 | 1111101111 | 2 | -1 | 0111101111 | -2 | -1 |
| FC | 11111100 | 1111111001 | 2 | 1 | 0111111001 | -2 | 1 |
| FD | 11111101 | 1111111011 | 2 | -1 | 0111111011 | -2 | -1 |
| FE | 11111110 | 1111111110 | 2 | -1 | 0111111110 | -2 | -1 |
| FF | 11111111 | 1111101010 | 2 | -1 | 011101010 | -2 | -1 |
| SYNC | PATTERN | 0100010001 | 0 | 1 | 1100010001 | 0 | 1 |

FIG.7

| DATA | | CODE | | | | | | CONTINUOUS NUMBER |
|---|---|---|---|---|---|---|---|---|
| | | Q'=-1 | | | Q'=1 | | | |
| Hex | Binary | CODE | DC | Q | CODE | DC | Q | |
| EB | 11101011 | 1111111111 | 0 | -1 | 1111111111 | 0 | 1 | INFINITE |
| 2B | 00101011 | 0111111111 | 0 | 1 | 0111111111 | 0 | -1 | LAST 9 |
| FE | 11111110 | 1111111110 | 2 | -1 | 0111111110 | -2 | -1 | FIRST 9 |
| AB | 10101011 | 1011111111 | 2 | -1 | 0011111111 | -2 | -1 | LAST 8 |
| EA | 11101010 | 1111111101 | 0 | 1 | 1111111101 | 0 | -1 | FIRST 8 |
| 0B | 00001011 | 0101111111 | 0 | -1 | 0101111111 | 0 | 1 | LAST 7 |
| B3 | 10110011 | 1101111111 | 0 | 1 | 1101111111 | 0 | -1 | LAST 7 |
| EF | 11101111 | 1111111010 | 0 | -1 | 1111111010 | 0 | 1 | FIRST 7 |
| FC | 11111100 | 1111111001 | 2 | 1 | 0111111001 | -2 | 1 | FIRST 7 |
| FD | 11111101 | 1111111011 | 2 | -1 | 0111111011 | -2 | -1 | FIRST 7 |
| 4B | 01001011 | 0100111111 | 2 | -1 | 1100111111 | -2 | -1 | LAST 6 |
| 6B | 01101011 | 0010111111 | 0 | 1 | 0010111111 | 0 | -1 | LAST 6 |
| 8B | 10001011 | 1010111111 | 0 | -1 | 1010111111 | 0 | 1 | LAST 6 |
| CB | 11001011 | 1110111111 | 2 | -1 | 0110111111 | -2 | -1 | LAST 6 |
| 33 | 00110011 | 1111110010 | 0 | 1 | 1111110010 | 0 | -1 | FIRST 6 |
| 34 | 00110100 | 0111110001 | 2 | 1 | 1111110001 | -2 | 1 | FIRST 6 |
| 35 | 00110101 | 0111110011 | 2 | -1 | 1111110011 | -2 | -1 | FIRST 6 |
| 36 | 00110110 | 0111110110 | 2 | -1 | 1111110110 | -2 | -1 | FIRST 6 |
| E8 | 11101000 | 1111110101 | 0 | -1 | 1111110101 | 0 | 1 | FIRST 6 |
| E9 | 11101001 | 1111110111 | 0 | 1 | 1111110111 | 0 | -1 | FIRST 6 |

FIG.11

| CODE | | | | | |
|---|---|---|---|---|---|
| Q' = -1 | | | Q' = 1 | | |
| CODE | DC | Q | CODE | DC | Q |
| 0111001001 | 0 | 1 | 0111001001 | 0 | -1 |
| 0111001011 | 0 | -1 | 0111001011 | 0 | 1 |
| 0111001110 | 0 | -1 | 0111001110 | 0 | 1 |
| 1110110010 | 2 | 1 | 0110110010 | -2 | 1 |
| 0010011011 | 2 | -1 | 1010011011 | -2 | -1 |
| 1100100110 | 2 | -1 | 0100100110 | -2 | -1 |
| 1100100011 | 2 | -1 | 0100100011 | -2 | -1 |
| 1011110010 | 2 | 1 | 0011110010 | -2 | 1 |
| 0010011110 | 2 | -1 | 1010011110 | -2 | -1 |
| 0100110010 | 2 | 1 | 1100110010 | -2 | 1 |
| 0010011001 | 2 | 1 | 101101001 | -2 | 1 |
| 0110100110 | 2 | -1 | 1110100110 | -2 | -1 |
| 0110100011 | 2 | -1 | 1110100011 | -2 | -1 |
| 0011100110 | 2 | -1 | 1011100110 | -2 | -1 |
| 0011100011 | 2 | -1 | 1011100011 | -2 | -1 |

FIG.12

| DATA | | CODE | | | | | |
|---|---|---|---|---|---|---|---|
| | | Q'= -1 | | | Q'=1 | | |
| Hex | Binary | CODE | DC | Q | CODE | DC | Q |
| A6 | 10100110 | 1011001110 | 2 | 1 | 0011001110 | -2 | 1 |
| C6 | 11000110 | 1110001110 | 2 | 1 | 0110001110 | -2 | 1 |
| 76 | 01110110 | 0010110110 | 2 | -1 | 1010110110 | -2 | -1 |
| A7 | 10100111 | 1011011010 | 2 | 1 | 0011011010 | -2 | 1 |
| C5 | 11000101 | 1110001011 | 2 | 1 | 0110001011 | -2 | 1 |
| 47 | 01000111 | 0100011010 | 2 | 1 | 1100011010 | -2 | 1 |
| 74 | 01110100 | 0010110001 | 2 | 1 | 1010110001 | -2 | 1 |
| 75 | 01110101 | 0010110011 | 2 | -1 | 1010110011 | -2 | -1 |
| A5 | 10100101 | 1011001011 | 2 | 1 | 0011001011 | -2 | 1 |
| C7 | 11000111 | 1110011010 | 2 | 1 | 0110011010 | -2 | 1 |
| C4 | 11000100 | 1110001001 | 2 | -1 | 0110001001 | -2 | -1 |
| 34 | 00110100 | 0111110001 | 2 | 1 | 1111110001 | -2 | 1 |
| 39 | 00111001 | 0111000111 | 2 | 1 | 1111000111 | -2 | 1 |
| 43 | 01000011 | 0100011111 | 2 | 1 | 1100011111 | -2 | 1 |
| 7E | 01111110 | 0011111110 | 0 | 1 | 0011111110 | 0 | -1 |
| A4 | 10100100 | 1011001001 | 2 | -1 | 0011001001 | -2 | -1 |

FIG.13

| DATA | | CODE | | | | | |
|---|---|---|---|---|---|---|---|
| | | Q'=-1 | | | Q'=1 | | |
| Hex | Binary | CODE | DC | Q | CODE | DC | Q |
| 00 | 00000000 | 0101010101 | 0 | 1 | 0101010101 | 0 | -1 |
| 01 | 00000001 | 0101010111 | 0 | -1 | 0101010111 | 0 | 1 |
| 02 | 00000010 | 0101011101 | 0 | -1 | 0101011101 | 0 | 1 |
| 03 | 00000011 | 0101011111 | 0 | 1 | 0101011111 | 0 | -1 |
| 04 | 00000100 | 0101001001 | 0 | -1 | 0101001001 | 0 | 1 |
| 05 | 00000101 | 0101001011 | 0 | 1 | 0101001011 | 0 | -1 |
| 06 | 00000110 | 0101001110 | 0 | 1 | 0101001110 | 0 | -1 |
| 07 | 00000111 | 0101011010 | 0 | 1 | 0101011010 | 0 | -1 |
| 08 | 00001000 | 0101110101 | 0 | -1 | 0101110101 | 0 | 1 |
| 09 | 00001001 | 0101110111 | 0 | 1 | 0101110111 | 0 | -1 |
| 0A | 00001010 | 0101111101 | 0 | 1 | 0101111101 | 0 | -1 |
| 0B | 00001011 | 0101111111 | 0 | -1 | 0101111111 | 0 | 1 |
| 0C | 00001100 | 0101101001 | 0 | 1 | 0101101001 | 0 | -1 |
| 0D | 00001101 | 0101101011 | 0 | -1 | 0101101011 | 0 | 1 |
| 0E | 00001110 | 0101101110 | 0 | -1 | 0101101110 | 0 | 1 |
| 0F | 00001111 | 0101111010 | 0 | -1 | 0101111010 | 0 | 1 |
| 10 | 00010000 | 1101010010 | 0 | 1 | 1101010010 | 0 | -1 |
| 11 | 00010001 | 0100010010 | 2 | -1 | 1100010010 | -2 | -1 |
| 12 | 00010010 | 0101010010 | 0 | -1 | 0101010010 | 0 | 1 |
| 13 | 00010011 | 0101110010 | 0 | 1 | 0101110010 | 0 | -1 |
| 14 | 00010100 | 1101110001 | 2 | 1 | 0101110001 | -2 | 1 |
| 15 | 00010101 | 1101110011 | 2 | -1 | 0101110011 | -2 | -1 |
| 16 | 00010110 | 1101110110 | 2 | -1 | 0101110110 | -2 | -1 |
| 17 | 00010111 | 1101110010 | 0 | -1 | 1101110010 | 0 | 1 |
| 18 | 00011000 | 0101100101 | 2 | -1 | 1101100101 | -2 | -1 |
| 19 | 00011001 | 0101100111 | 2 | 1 | 1101100111 | -2 | 1 |
| 1A | 00011010 | 0101101101 | 2 | 1 | 1101101101 | -2 | 1 |
| 1B | 00011011 | 0101101111 | 2 | -1 | 1101101111 | -2 | -1 |
| 1C | 00011100 | 0101111001 | 2 | 1 | 1101111001 | -2 | 1 |
| 1D | 00011101 | 0101111011 | 2 | -1 | 1101111011 | -2 | -1 |
| 1E | 00011110 | 0101111110 | 2 | -1 | 1101111110 | -2 | -1 |
| 1F | 00011111 | 0101101010 | 2 | -1 | 1101101010 | -2 | -1 |
| 20 | 00100000 | 0111010101 | 0 | -1 | 0111010101 | 0 | 1 |
| 21 | 00100001 | 0111010111 | 0 | 1 | 0111010111 | 0 | -1 |
| 22 | 00100010 | 0111011101 | 0 | 1 | 0111011101 | 0 | -1 |
| 23 | 00100011 | 0111011111 | 0 | -1 | 0111011111 | 0 | 1 |
| 24 | 00100100 | 1111010001 | 2 | 1 | 0111010001 | -2 | 1 |
| 25 | 00100101 | 1111010011 | 2 | -1 | 0111010011 | -2 | -1 |
| 26 | 00100110 | 1111010110 | 2 | -1 | 0111010110 | -2 | -1 |
| 27 | 00100111 | 0111011010 | 0 | -1 | 0111011010 | 0 | 1 |

FIG.14

| DATA | | CODE | | | | | |
|---|---|---|---|---|---|---|---|
| | | Q'= -1 | | | Q'=1 | | |
| Hex | Binary | CODE | DC | Q | CODE | DC | Q |
| 28 | 00101000 | 0111110101 | 0 | 1 | 0111110101 | 0 | -1 |
| 29 | 00101001 | 0111110111 | 0 | -1 | 0111110111 | 0 | 1 |
| 2A | 00101010 | 0111111101 | 0 | -1 | 0111111101 | 0 | 1 |
| 2B | 00101011 | 0111111111 | 2 | -1 | 1010011011 | -2 | -1 |
| 2C | 00101100 | 0111101001 | 0 | -1 | 0111101001 | 0 | 1 |
| 2D | 00101101 | 0111101011 | 0 | 1 | 0111101011 | 0 | -1 |
| 2E | 00101110 | 0111101110 | 0 | 1 | 0111101110 | 0 | -1 |
| 2F | 00101111 | 0111111010 | 0 | 1 | 0111111010 | 0 | -1 |
| 30 | 00110000 | 0111010010 | 0 | 1 | 0111010010 | 0 | -1 |
| 31 | 00110001 | 1110010010 | 2 | -1 | 0110010010 | -2 | -1 |
| 32 | 00110010 | 1111010010 | 0 | -1 | 1111010010 | 0 | 1 |
| 33 | 00110011 | 1111110010 | 0 | 1 | 1111110010 | 0 | -1 |
| 34 | 00110100 | 0111110001 | 2 | 1 | 1111110001 | -2 | 1 |
| 35 | 00110101 | 0111110011 | 2 | -1 | 1111110011 | -2 | -1 |
| 36 | 00110110 | 0111110110 | 2 | -1 | 1111110110 | -2 | -1 |
| 37 | 00110111 | 0111110010 | 0 | -1 | 0111110010 | 0 | 1 |
| 38 | 00111000 | 0111000101 | 2 | -1 | 1111000101 | -2 | -1 |
| 39 | 00111001 | 0111000111 | 2 | 1 | 1111000111 | -2 | 1 |
| 3A | 00111010 | 0111001101 | 2 | 1 | 1111001101 | -2 | 1 |
| 3B | 00111011 | 0111001111 | 2 | -1 | 1111001111 | -2 | -1 |
| 3C | 00111100 | 0111011001 | 2 | 1 | 1111011001 | -2 | 1 |
| 3D | 00111101 | 0111011011 | 2 | -1 | 1111011001 | -2 | -1 |
| 3E | 00111110 | 0111011110 | 2 | -1 | 1111011110 | -2 | -1 |
| 3F | 00111111 | 0111001010 | 2 | -1 | 1111001010 | -2 | -1 |
| 40 | 01000000 | 0100010101 | 2 | 1 | 1100010101 | -2 | 1 |
| 41 | 01000001 | 0100010111 | 2 | -1 | 1100010111 | -2 | -1 |
| 42 | 01000010 | 0100011101 | 2 | -1 | 1100011101 | -2 | -1 |
| 43 | 01000011 | 0100011111 | 2 | 1 | 1100011111 | -2 | 1 |
| 44 | 01000100 | 0101010001 | 2 | 1 | 1101010001 | -2 | 1 |
| 45 | 01000101 | 0101010011 | 2 | -1 | 1101010011 | -2 | -1 |
| 46 | 01000110 | 0101010110 | 2 | -1 | 1101010110 | -2 | -1 |
| 47 | 01000111 | 0100011010 | 2 | 1 | 1100011010 | -2 | 1 |
| 48 | 01001000 | 0100110101 | 2 | -1 | 1100110101 | -2 | -1 |
| 49 | 01001001 | 0100110111 | 2 | 1 | 1100110111 | -2 | 1 |
| 4A | 01001010 | 0100111101 | 2 | 1 | 1100111101 | -2 | 1 |
| 4B | 01001011 | 0100111111 | 2 | -1 | 1100111111 | -2 | -1 |
| 4C | 01001100 | 0100101001 | 2 | 1 | 1100101001 | -2 | 1 |
| 4D | 01001101 | 0100101011 | 2 | -1 | 1100101011 | -2 | -1 |
| 4E | 01001110 | 0100101110 | 2 | -1 | 1100101110 | -2 | -1 |
| 4F | 01001111 | 0100111010 | 2 | -1 | 1100111010 | -2 | -1 |

FIG.15

| DATA | | CODE | | | | | |
|---|---|---|---|---|---|---|---|
| | | Q'= -1 | | | Q'=1 | | |
| Hex | Binary | CODE | DC | Q | CODE | DC | Q |
| 50 | 01010000 | 0100100101 | 0 | -1 | 0100100101 | 0 | 1 |
| 51 | 01010001 | 0100100111 | 0 | 1 | 0100100111 | 0 | -1 |
| 52 | 01010010 | 0100101101 | 0 | 1 | 0100101101 | 0 | -1 |
| 53 | 01010011 | 0100101111 | 0 | -1 | 0100101111 | 0 | 1 |
| 54 | 01010100 | 0100111001 | 0 | 1 | 0100111001 | 0 | -1 |
| 55 | 01010101 | 0100111011 | 0 | -1 | 0100111011 | 0 | 1 |
| 56 | 01010110 | 0100111110 | 0 | -1 | 0100111110 | 0 | 1 |
| 57 | 01010111 | 0100101010 | 0 | -1 | 0100101010 | 0 | 1 |
| 58 | 01011000 | 0110100101 | 0 | 1 | 0110100101 | 0 | -1 |
| 59 | 01011001 | 0110100111 | 0 | -1 | 0110100111 | 0 | 1 |
| 5A | 01011010 | 0110101101 | 0 | -1 | 0110101101 | 0 | 1 |
| 5B | 01011011 | 0110101111 | 0 | 1 | 0110101111 | 0 | -1 |
| 5C | 01011100 | 0110111001 | 0 | -1 | 0110111001 | 0 | 1 |
| 5D | 01011101 | 0110111011 | 0 | 1 | 0110111011 | 0 | -1 |
| 5E | 01011110 | 0110111110 | 0 | 1 | 0110111110 | 0 | -1 |
| 5F | 01011111 | 0110101010 | 0 | 1 | 0110101010 | 0 | -1 |
| 60 | 01100000 | 0010010101 | 0 | -1 | 0010010101 | 0 | 1 |
| 61 | 01100001 | 0010010111 | 0 | 1 | 0010010111 | 0 | -1 |
| 62 | 01100010 | 0010011101 | 0 | 1 | 0010011101 | 0 | -1 |
| 63 | 01100011 | 0010011111 | 0 | -1 | 0010011111 | 0 | 1 |
| 64 | 01100100 | 1010010001 | 2 | 1 | 0010010001 | -2 | 1 |
| 65 | 01100101 | 1010010011 | 2 | -1 | 0010010011 | -2 | -1 |
| 66 | 01100110 | 1010010110 | 2 | -1 | 0010010110 | -2 | -1 |
| 67 | 01100111 | 0010011010 | 0 | -1 | 0010011010 | 0 | 1 |
| 68 | 01101000 | 0010110101 | 0 | 1 | 0010110101 | 0 | -1 |
| 69 | 01101001 | 0010110111 | 0 | -1 | 0010110111 | 0 | 1 |
| 6A | 01101010 | 0010111101 | 0 | -1 | 0010111101 | 0 | 1 |
| 6B | 01101011 | 0010111111 | 0 | 1 | 0010111111 | 0 | -1 |
| 6C | 01101100 | 0010101001 | 0 | -1 | 0010101001 | 0 | 1 |
| 6D | 01101101 | 0010101011 | 0 | 1 | 0010101011 | 0 | -1 |
| 6E | 01101110 | 0010101110 | 0 | 1 | 0010101110 | 0 | -1 |
| 6F | 01101111 | 0010111010 | 0 | 1 | 0010111010 | 0 | -1 |
| 70 | 01110000 | 0010010010 | 0 | 1 | 0010010010 | 0 | -1 |
| 71 | 01110001 | 1011010010 | 2 | -1 | 0011010010 | -2 | -1 |
| 72 | 01110010 | 1010010010 | 0 | -1 | 1010010010 | 0 | 1 |
| 73 | 01110011 | 1010110010 | 0 | 1 | 1010110010 | 0 | -1 |
| 74 | 01110100 | 0010110001 | 2 | 1 | 1010110001 | -2 | 1 |
| 75 | 01110101 | 0010110011 | 2 | -1 | 1010110011 | -2 | -1 |
| 76 | 01110110 | 0010110110 | 2 | -1 | 1010011110 | -2 | -1 |
| 77 | 01110111 | 0010110010 | 0 | -1 | 0010110010 | 0 | 1 |

FIG.16

| DATA | | CODE | | | | | |
|---|---|---|---|---|---|---|---|
| | | Q'=-1 | | | Q'=1 | | |
| Hex | Binary | CODE | DC | Q | CODE | DC | Q |
| 78 | 01111000 | 0011100101 | 0 | 1 | 0011100101 | 0 | -1 |
| 79 | 01111001 | 0011100111 | 0 | -1 | 0011100111 | 0 | 1 |
| 7A | 01111010 | 0011101101 | 0 | -1 | 0011101101 | 0 | 1 |
| 7B | 01111011 | 0011101111 | 0 | 1 | 0011101111 | 0 | -1 |
| 7C | 01111100 | 0011111001 | 0 | -1 | 0011111001 | 0 | 1 |
| 7D | 01111101 | 0011111011 | 0 | 1 | 0011111011 | 0 | -1 |
| 7E | 01111110 | 0011111110 | 0 | 1 | 0011111110 | 0 | -1 |
| 7F | 01111111 | 0011101010 | 0 | 1 | 0011101010 | 0 | -1 |
| 80 | 10000000 | 1010010101 | 0 | 1 | 1010010101 | 0 | -1 |
| 81 | 10000001 | 1010010111 | 0 | -1 | 1010010111 | 0 | 1 |
| 82 | 10000010 | 1010011101 | 0 | -1 | 1010011101 | 0 | 1 |
| 83 | 10000011 | 1010011111 | 0 | 1 | 1010011111 | 0 | -1 |
| 84 | 10000100 | 1010001001 | 0 | -1 | 1010001001 | 0 | 1 |
| 85 | 10000101 | 1010001011 | 0 | 1 | 1010001011 | 0 | -1 |
| 86 | 10000110 | 1010001110 | 0 | 1 | 1010001110 | 0 | -1 |
| 87 | 10000111 | 1010011010 | 0 | 1 | 1010011010 | 0 | -1 |
| 88 | 10001000 | 1010110101 | 0 | -1 | 1010110101 | 0 | 1 |
| 89 | 10001001 | 1010110111 | 0 | 1 | 1010110111 | 0 | -1 |
| 8A | 10001010 | 1010111101 | 0 | 1 | 1010111101 | 0 | -1 |
| 8B | 10001011 | 1010111111 | 0 | -1 | 1010111111 | 0 | 1 |
| 8C | 10001100 | 1010101001 | 0 | 1 | 1010101001 | 0 | -1 |
| 8D | 10001101 | 1010101011 | 0 | -1 | 1010101011 | 0 | 1 |
| 8E | 10001110 | 1010101110 | 0 | -1 | 1010101110 | 0 | 1 |
| 8F | 10001111 | 1010111010 | 0 | -1 | 1010111010 | 0 | 1 |
| 90 | 10010000 | 1100100101 | 0 | 1 | 1100100101 | 0 | -1 |
| 91 | 10010001 | 1100100111 | 0 | -1 | 1100100111 | 0 | 1 |
| 92 | 10010010 | 1100101101 | 0 | -1 | 1100101101 | 0 | 1 |
| 93 | 10010011 | 1100101111 | 0 | 1 | 1100101111 | 0 | -1 |
| 94 | 10010100 | 1100111001 | 0 | -1 | 1100111001 | 0 | 1 |
| 95 | 10010101 | 1100111011 | 0 | 1 | 1100111011 | 0 | -1 |
| 96 | 10010110 | 1100111110 | 0 | 1 | 1100111110 | 0 | -1 |
| 97 | 10010111 | 1100101010 | 0 | 1 | 1100101010 | 0 | -1 |
| 98 | 10011000 | 1010100101 | 2 | -1 | 0010100101 | -2 | -1 |
| 99 | 10011001 | 1010100111 | 2 | 1 | 0010100111 | -2 | 1 |
| 9A | 10011010 | 1010101101 | 2 | 1 | 0010101101 | -2 | 1 |
| 9B | 10011011 | 1010101111 | 2 | -1 | 0010101111 | -2 | -1 |
| 9C | 10011100 | 1010111001 | 2 | 1 | 0010111001 | -2 | 1 |
| 9D | 10011101 | 1010111011 | 2 | -1 | 0010111011 | -2 | -1 |
| 9E | 10011110 | 1010111110 | 2 | -1 | 0010111110 | -2 | -1 |
| 9F | 10011111 | 1010101010 | 2 | -1 | 0010101010 | -2 | -1 |

FIG.17

| DATA | | CODE | | | | | |
|---|---|---|---|---|---|---|---|
| | | Q'=-1 | | | Q'=1 | | |
| Hex | Binary | CODE | DC | Q | CODE | DC | Q |
| A0 | 10100000 | 1011010101 | 2 | 1 | 0011010101 | -2 | 1 |
| A1 | 10100001 | 1011010111 | 2 | -1 | 0011010111 | -2 | -1 |
| A2 | 10100010 | 1011011101 | 2 | -1 | 0011011101 | -2 | -1 |
| A3 | 10100011 | 1011011111 | 2 | 1 | 0011011111 | -2 | 1 |
| A4 | 10100100 | 1011001001 | 2 | -1 | 0011001001 | -2 | -1 |
| A5 | 10100101 | 1011001011 | 2 | 1 | 0011001011 | -2 | 1 |
| A6 | 10100110 | 0111001110 | 0 | -1 | 0111001110 | 0 | 1 |
| A7 | 10100111 | 1011011010 | 2 | 1 | 0011011010 | -2 | 1 |
| A8 | 10101000 | 1011110101 | 2 | -1 | 0011110101 | -2 | -1 |
| A9 | 10101001 | 1011110111 | 2 | 1 | 0011110111 | -2 | 1 |
| AA | 10101010 | 1011111101 | 2 | 1 | 0011111101 | -2 | 1 |
| AB | 10101011 | 1110110010 | 2 | 1 | 0110110010 | -2 | 1 |
| AC | 10101100 | 1011101001 | 2 | 1 | 0011101001 | -2 | 1 |
| AD | 10101101 | 1011101011 | 2 | -1 | 0011101011 | -2 | -1 |
| AE | 10101110 | 1011101110 | 2 | -1 | 0011101110 | -2 | -1 |
| AF | 10101111 | 1011111010 | 2 | -1 | 0011111010 | -2 | -1 |
| B0 | 10110000 | 1101110101 | 0 | 1 | 1101110101 | 0 | -1 |
| B1 | 10110001 | 1101110111 | 0 | -1 | 1101110111 | 0 | 1 |
| B2 | 10110010 | 1101111101 | 0 | -1 | 1101111101 | 0 | 1 |
| B3 | 10110011 | 1101111111 | 0 | 1 | 1101111111 | 0 | -1 |
| B4 | 10110100 | 1101101001 | 0 | -1 | 1101101001 | 0 | 1 |
| B5 | 10110101 | 1101101011 | 0 | 1 | 1101101011 | 0 | -1 |
| B6 | 10110110 | 1101101110 | 0 | 1 | 1101101110 | 0 | -1 |
| B7 | 10110111 | 1101111010 | 0 | 1 | 1101111010 | 0 | -1 |
| B8 | 10111000 | 1011100101 | 0 | -1 | 1011100101 | 0 | 1 |
| B9 | 10111001 | 1011100111 | 0 | 1 | 1011100111 | 0 | -1 |
| BA | 10111010 | 1011101101 | 0 | 1 | 1011101101 | 0 | -1 |
| BB | 10111011 | 1011101111 | 0 | -1 | 1011101111 | 0 | 1 |
| BC | 10111100 | 1011111001 | 0 | 1 | 1011111001 | 0 | -1 |
| BD | 10111101 | 1011111011 | 0 | -1 | 1011111011 | 0 | 1 |
| BE | 10111110 | 1011111110 | 0 | -1 | 1011111110 | 0 | 1 |
| BF | 10111111 | 1011101010 | 0 | -1 | 1011101010 | 0 | 1 |
| C0 | 11000000 | 1110010101 | 2 | 1 | 0110010101 | -2 | 1 |
| C1 | 11000001 | 1110010111 | 2 | -1 | 0110010111 | -2 | -1 |
| C2 | 11000010 | 1110011101 | 2 | -1 | 0110011101 | -2 | -1 |
| C3 | 11000011 | 1110011111 | 2 | 1 | 0110011111 | -2 | 1 |
| C4 | 11000100 | 1110001001 | 2 | -1 | 0110001001 | -2 | -1 |
| C5 | 11000101 | 1100100011 | 2 | -1 | 0100100011 | -2 | -1 |
| C6 | 11000110 | 0111001011 | 0 | -1 | 0111001011 | 0 | 1 |
| C7 | 11000111 | 1110011010 | 2 | 1 | 0110011010 | -2 | 1 |

FIG.18

| DATA | | CODE | | | | | |
|---|---|---|---|---|---|---|---|
| | | Q'=-1 | | | Q'=1 | | |
| Hex | Binary | CODE | DC | Q | CODE | DC | Q |
| C8 | 11001000 | 1110110101 | 2 | -1 | 0110110101 | -2 | -1 |
| C9 | 11001001 | 1110110111 | 2 | 1 | 0110110111 | -2 | 1 |
| CA | 11001010 | 1110111101 | 2 | 1 | 0110111101 | -2 | 1 |
| CB | 11001011 | 1110111111 | 2 | -1 | 0110111111 | -2 | -1 |
| CC | 11001100 | 1110101001 | 2 | 1 | 0110101001 | -2 | 1 |
| CD | 11001101 | 1110101011 | 2 | -1 | 0110101011 | -2 | -1 |
| CE | 11001110 | 1110101110 | 2 | -1 | 0110101110 | -2 | -1 |
| CF | 11001111 | 1110111010 | 2 | -1 | 0110111010 | -2 | -1 |
| D0 | 11010000 | 1101000101 | 2 | -1 | 0101000101 | -2 | -1 |
| D1 | 11010001 | 1101000111 | 2 | 1 | 0101000111 | -2 | 1 |
| D2 | 11010010 | 1101001101 | 2 | 1 | 0101001101 | -2 | 1 |
| D3 | 11010011 | 1101001111 | 2 | -1 | 0101001111 | -2 | -1 |
| D4 | 11010100 | 1101011001 | 2 | 1 | 0101011001 | -2 | 1 |
| D5 | 11010101 | 1101011011 | 2 | -1 | 0101011011 | -2 | -1 |
| D6 | 11010110 | 1101011110 | 2 | -1 | 0101011110 | -2 | -1 |
| D7 | 11010111 | 1101001010 | 2 | -1 | 0101001010 | -2 | -1 |
| D8 | 11011000 | 1110100101 | 0 | -1 | 1110100101 | 0 | 1 |
| D9 | 11011001 | 1110100111 | 0 | 1 | 1110100111 | 0 | -1 |
| DA | 11011010 | 1110101101 | 0 | 1 | 1110101101 | 0 | -1 |
| DB | 11011011 | 1110101111 | 0 | -1 | 1110101111 | 0 | 1 |
| DC | 11011100 | 1110111001 | 0 | 1 | 1110111001 | 0 | -1 |
| DD | 11011101 | 1110111011 | 0 | -1 | 1110111011 | 0 | 1 |
| DE | 11011110 | 1110111110 | 0 | -1 | 1110111110 | 0 | 1 |
| DF | 11011111 | 1110101010 | 0 | -1 | 1110101010 | 0 | 1 |
| E0 | 11100000 | 1111010101 | 0 | 1 | 1111010101 | 0 | -1 |
| E1 | 11100001 | 1111010111 | 0 | -1 | 1111010111 | 0 | 1 |
| E2 | 11100010 | 1111011101 | 0 | -1 | 1111011101 | 0 | 1 |
| E3 | 11100011 | 1111011111 | 0 | 1 | 1111011111 | 0 | -1 |
| E4 | 11100100 | 1111001001 | 0 | -1 | 1111001001 | 0 | 1 |
| E5 | 11100101 | 1111001011 | 0 | 1 | 1111001011 | 0 | -1 |
| E6 | 11100110 | 1111001110 | 0 | 1 | 1111001110 | 0 | -1 |
| E7 | 11100111 | 1111011010 | 0 | 1 | 1111011010 | 0 | -1 |
| E8 | 11101000 | 1111110101 | 0 | -1 | 1111110101 | 0 | 1 |
| E9 | 11101001 | 1111110111 | 0 | 1 | 1111110111 | 0 | -1 |
| EA | 11101010 | 1011110010 | 2 | 1 | 0011110010 | -2 | 1 |
| EB | 11101011 | 0111001001 | 0 | 1 | 0111001001 | 0 | -1 |
| EC | 11101100 | 1111101001 | 0 | 1 | 1111101001 | 0 | -1 |
| ED | 11101101 | 1111101011 | 0 | -1 | 1111101011 | 0 | 1 |
| EE | 11101110 | 1111101110 | 0 | -1 | 1111101110 | 0 | 1 |
| EF | 11101111 | 1111111010 | 0 | -1 | 1111111010 | 0 | 1 |

FIG.19

| DATA | | CODE | | | | | |
|---|---|---|---|---|---|---|---|
| | | Q'=-1 | | | Q'=1 | | |
| Hex | Binary | CODE | DC | Q | CODE | DC | Q |
| F0 | 11110000 | 1101010101 | 0 | -1 | 1101010101 | 0 | 1 |
| F1 | 11110001 | 1101010111 | 0 | 1 | 1101010111 | 0 | -1 |
| F2 | 11110010 | 1101011101 | 0 | 1 | 1101011101 | 0 | -1 |
| F3 | 11110011 | 1101011111 | 0 | -1 | 1101011111 | 0 | 1 |
| F4 | 11110100 | 1101001001 | 0 | 1 | 1101001001 | 0 | -1 |
| F5 | 11110101 | 1101001011 | 0 | -1 | 1101001011 | 0 | 1 |
| F6 | 11110110 | 1101001110 | 0 | -1 | 1101001110 | 0 | 1 |
| F7 | 11110111 | 1101011010 | 0 | -1 | 1101011010 | 0 | 1 |
| F8 | 11111000 | 1111100101 | 2 | -1 | 0111100101 | -2 | -1 |
| F9 | 11111001 | 1111100111 | 2 | 1 | 0111100111 | -2 | 1 |
| FA | 11111010 | 1111101101 | 2 | 1 | 0111101101 | -2 | 1 |
| FB | 11111011 | 1111101111 | 2 | -1 | 0111101111 | -2 | -1 |
| FC | 11111100 | 1111111001 | 2 | 1 | 0111111001 | -2 | 1 |
| FD | 11111101 | 1111111011 | 2 | -1 | 0111111011 | -2 | -1 |
| FE | 11111110 | 1100100110 | 2 | -1 | 0100100110 | -2 | -1 |
| FF | 11111111 | 1111101010 | 2 | -1 | 0111101010 | -2 | -1 |
| SYNC | PATTERN | 0100010001 | 0 | 1 | 1100010001 | 0 | 1 |

FIG.20

| CODE | | | | | |
|---|---|---|---|---|---|
| Q' = -1 | | | Q' = 1 | | |
| CODE | DC | Q | CODE | DC | Q |
| 0010011110 | 2 | -1 | 1010011110 | -2 | -1 |
| 1011110010 | 2 | 1 | 0011110010 | -2 | 1 |
| 1100100011 | 2 | -1 | 0100100011 | -2 | -1 |
| 1100100110 | 2 | -1 | 0100100110 | -2 | -1 |
| 0010011011 | 2 | -1 | 1010011011 | -2 | -1 |
| 1110110010 | 2 | 1 | 0110110010 | -2 | 1 |
| 0111001110 | 0 | -1 | 0111001110 | 0 | 1 |
| 0111001011 | 0 | -1 | 0111001011 | 0 | 1 |
| 0111001001 | 0 | 1 | 0111001001 | 0 | -1 |

FIG.21

| CODE | | | | | |
|---|---|---|---|---|---|
| Q' = -1 | | | Q' = 1 | | |
| CODE | DC | Q | CODE | DC | Q |
| 0010011001 | 2 | 1 | 1010011001 | -2 | 1 |
| 0010011110 | 2 | -1 | 1010011110 | -2 | -1 |
| 1011110010 | 2 | 1 | 0011110010 | -2 | 1 |
| 1100100011 | 2 | -1 | 0100100011 | -2 | -1 |
| 1100100110 | 2 | -1 | 0100100110 | -2 | -1 |
| 0010011011 | 2 | -1 | 1010011011 | -2 | -1 |
| 1110110010 | 2 | 1 | 0110110010 | -2 | 1 |
| 0111001110 | 0 | -1 | 0111001110 | 0 | 1 |
| 0111001011 | 0 | -1 | 0111001011 | 0 | 1 |
| 0111001001 | 0 | 1 | 0111001001 | 0 | -1 |

FIG.22

| CODE | | | | | |
|---|---|---|---|---|---|
| Q' = -1 | | | Q' = 1 | | |
| CODE | DC | Q | CODE | DC | Q |
| 0110100110 | 2 | -1 | 1110100110 | -2 | -1 |
| 0010011001 | 2 | 1 | 1010011001 | -2 | 1 |
| 0100110010 | 2 | 1 | 1100110010 | -2 | 1 |
| 0010011110 | 2 | -1 | 1010011110 | -2 | -1 |
| 1011110010 | 2 | 1 | 0011110010 | -2 | 1 |
| 1100100011 | 2 | -1 | 0100100011 | -2 | -1 |
| 1100100110 | 2 | -1 | 0100100110 | -2 | -1 |
| 0010011011 | 2 | -1 | 1010011011 | -2 | -1 |
| 1110110010 | 2 | 1 | 0110110010 | -2 | 1 |
| 0111001110 | 0 | -1 | 0111001110 | 0 | 1 |
| 0111001011 | 0 | -1 | 0111001011 | 0 | 1 |
| 0111001001 | 0 | 1 | 0111001001 | 0 | -1 |

MODULATION METHOD, RECORDING METHOD, REPRODUCING METHOD, RECORDING AND REPRODUCING APPARATUS, RECORDING AND REPRODUCING METHOD, AND REPRODUCING APPARATUS

BACKGROUND OF THE INVENTION

This invention relates to a modulation method, a recording method, a reproducing method, a recording and reproducing apparatus, a recording and reproducing method, and a reproducing apparatus, and particularly to eight-to-ten (8–10) modulation for transforming 8-bit data to a 10-bit code.

In a digital audio tape recorder (DAT) for recording and reproducing audio data into and from a recording medium, such as, a magnetic tape, 8–10 modulation is employed whereby 8-bit data is transformed to a 10-bit code.

Specifically, in the conventional 8–10 modulation, 8-bit data is transformed to a 10-bit code in accordance with a code table in which codes being (0,3;8,10;1) codes and having a so-called codeword digital sum (CDS), that is, a value obtained by subtracting the number of "0s" from the number of "1s" of the code after non return to zero inverted (NRZI) modulation or a digital sum value (DSV) per code, equal to 0, ±2, are allocated to 8-bit data, as shown in FIGS. 1 to 7. The code table is hereinafter referred to a DDS2 code table. In FIGS. 1 to 7, a value indicated by Q is the DSV for codes up to the corresponding code, and a value indicated by Q' is the DSV for codes up to the preceding code of the corresponding code. Either one of two codes allocated to one data is employed by a so-called low disparity code (LDC).

DAT has a recording system composed of an 8–10 modulator 61, an NRZI modulator 82 and the like, and a reproducing system composed of an integral equalizer 73, a binary coding circuit 74, an NRZI demodulator 77, an 8–10 demodulator 78 and the like, as shown in FIG. 8. The 8–10 demodulator 61 transforms 8-bit data to a 10-bit code. The NRZI modulator 62 NRZI modulates the code, and supplies the resulting code through a recording amplifier 63 to a so-called rotary head 64. Thus, audio data is recorded onto a magnetic tape 5 by a so-called helical scan.

In reproduction of audio data, on the other hand, the integral equalizer 73 integrally equalizes reproduction signals reproduced from the magnetic tape 5 by a rotary head 71. The binary coding circuit 74 encodes the equalized reproduction signals (hereinafter referred to as the equalized waveform) to a binary code. The NRZI demodulator 77 NRZI demodulates the resulting code to reproduce the 10-bit code. The 8–10 demodulator 78 then transforms this code to 8-bit data. Thus, audio data is reproduced. A phase locked loop (PLL) 75 reproduces a channel clock, and a synchronization detection circuit 76 detects a delimiter of codes, for example.

DAT has also been used as a data recorder for storing data for information processing devices, other than audio data, recently. The data recorder also employs the above-mentioned 8–10 modulator, integral equalizer and binary coding circuit.

Meanwhile, the conventional data recorder employs the above-described integral equalizer. That is, the linear recording density along tracks of the magnetic tape is set to, for example, 61 kbps, which does not cause intersymbol interference in reproduction signals. Therefore, high recording density cannot be realized with the conventional circuit configuration.

Thus, it is conceivable to use a technique of so-called partial response for controlling the quantity of intersymbol interference to increase the linear recording density. Specifically, an equalizer of partial response class 1 may be used instead of the integral equalizer 73, and a Viterbi decoder may be used instead of the binary coding circuit 74.

In the conventional DDS2 code table, codes having a number of consecutive 1's are employed, such as, codes "1111111111", "0111111111" and "1111111110" allocated to data of "11101011", "00101011" and "11111110" in binary expression, as shown in FIGS. 1 to 7. The data of "11101011" is hereinafter referred to as data EB. On the basis of a waveform string obtained by NRZI modulating these codes, recording of data onto the magnetic tape is carried out as inversion of magnetization polarity. Accordingly, when a ternary reproduction signal obtained as differential of magnetization polarity inversion is equalized by partial response class 1 for the code having a number of consecutive 1's, a number of consecutive 0's appear in the equalized waveform.

Two threshold values to discriminate the ternary equalized waveform (a so-called eye pattern) are determined on the basis of envelopes of the equalized waveform so as to correspond to level changes of the reproduction signal. Therefore, a large number of consecutive 0's in the equalized waveform prevent these threshold values from being obtained stably, and thus increase the error rate. In addition, a determination of whether the level is lowered by so-called dropout or by the consecutive 0's cannot be accomplished.

In Viterbi decoding, data cannot be determined when continuous 0's are present in the equalized waveform in so-called maximum likelihood decoding. Stated differently, when a large number of continuous 1's are used as described above, the memory of the Viterbi decoder must be increased. Thus, the circuit scale is enlarged.

Also, in the conventional DDS2 code table, codes "1011001110", "0011001110", "1110001110" and "0110001110" are allocated to data AC and C6, as shown in FIGS. 1 to 7. These codes generate, when used twice, lengths between transition 1T, 4T, 1T, 3T, 1T or 1T, 3T, 1T, 4T, 1T in the waveform string, with T denoting the minimum length between transition. That is, these codes generate a large peak shift, causing the error rate to be higher to that of other codes. In the conventional 8–10 modulation, continuation of identical codes is not taken into account, and the codes of higher error rate are employed.

OBJECT AND SUMMARY OF THE INVENTION

In view of the above-described status of the art, it is an object of the present invention to provide a modulation method, a recording method, a reproducing method, a recording and reproducing apparatus, a recording and reproducing method, and a reproducing apparatus whereby it is possible to realize higher recording density of the recording medium, lower the error rate in comparison to the conventional case, and easily determine data in Viterbi decoding.

According to the present invention, there is provided a modulation method for transforming data to a code using a code having CDS after NRZI modulation equal to 0, ±2 of (0,3;8,10;1) code, the method comprising the step of transforming 8-bit data to a 10-bit code, using only a code such that the number of continuous 1's is not greater than N, with N being 12 to 18, in a code series of continuous codes.

According to the present invention, there is also provided a modulation method for transforming data to a code using a code having CDS after NRZI modulation equal to 0, ±2 of (0,3;8,10;1) code, the method comprising the step of transforming 8-bit data to a 10-bit code, using a code other than a code such that lengths between transition 1T, 4T, 1T, 3T, 1T, or 1T, 3T, 1T, 4T, 1T, with T denoting the minimum length between transition, are generated in a waveform string corresponding to continuation of two identical codes, the waveform string being produced by NRZI modulating a code series of continuous codes.

According to the present invention, there is also provided a modulation method for transforming data to a code using a code having CDS after NRZI modulation equal to 0, ±2 of (0,3;8,10;1) code, the method comprising the step of transforming 8-bit data to a 10-bit code, using a code other than a code such that lengths between transition 1T, 4T, 1T, 3T, 1T, or 1T, 3T, 1T, 4T, 1T, with T denoting the minimum length between transition, are generated in a waveform string corresponding to continuation of two identical codes, the waveform string being produced by NRZI modulating a code series of continuous codes, with the number of continuous 1's being not greater than N, with N being 12 to 18, in the code series.

According to the present invention, there is also provided a recording method for a recording medium comprising the steps of: transforming 8-bit data to a 10-bit code, using only a code such that the number of continuous 1's is not greater than N, with N being 12 to 18, in a code series of continuous codes, each code being a code having CDS after NRZI modulation equal to 0, ±2 of (0,3;8,10;1) code; NRZI modulating the transformed code series to generate a waveform string; and recording the resulting waveform string into the recording medium. According to the present invention, there is also provided a recording method for a recording medium comprising the steps of: transforming 8-bit data to a 10-bit code, using a code other than a code such that lengths between transition 1T, 4T, 1T, 3T, 1T, or 1T, 3T, 1T, 4T, 1T, with T denoting the minimum length between transition, are generated in a waveform string corresponding to continuation of two identical codes, the waveform string being produced by NRZI modulating a code series of continuous codes, each code being a code having CDS after NRZI modulation equal to 0, ±2 of (0,3;8,10;1) code; NRZI modulating the transformed code series to generate a waveform string; and recording the resulting waveform string into the recording medium.

According to the present invention, there is also provided a recording method for a recording medium comprising the steps of: transforming 8-bit data to a 10-bit code, using a code other than a code such that lengths between transition 1T, 4T, 1T, 3T, 1T, or 1T, 3T, 1T, 4T, 1T, with T denoting the minimum length between transition, are generated in a waveform string corresponding to continuation of two identical codes, the waveform string being produced by NRZI modulating a code series of continuous codes, each code being a code having CDS after NRZI modulation equal to 0, ±2 of (0,3;8,10;1) code, with the number of continuous 1's being not greater than N, N being 12 to 18, in the code series; NRZI modulating the transformed code series to generate a waveform string; and recording the resulting waveform string into the recording medium.

According to the present invention, there is also provided a reproducing method for a recording medium having a waveform string recorded therein, the waveform string being produced by transforming 8-bit data to a 10-bit code using only a code such that the number of continuous 1's is not greater than N, with N being 12 to 18, in a code series of continuous codes, each code being a code having CDS after NRZI modulation equal to 0, ±2 of (0,3;8,10;1) code, and then by NRZI modulating the code series of continuous codes, the reproducing method comprising the steps of: equalizing by partial response class 1 a reproduction signal reproduced from the recording medium; Viterbi decoding the equalized reproduction signal to generate a waveform string; NRZI demodulating the resulting waveform string to generate a code series; and transforming each 10-bit code of the resulting code series to 8-bit data for reproduction from the recording medium.

According to the present invention, there is also provided a reproducing method for a recording medium having a waveform string recorded therein, the waveform string being produced by transforming 8-bit data to a 10-bit code using a code other than a code such that lengths between transition 1T, 4T, 1T, 3T, 1T or 1T, 3T, 1T, 4T, 1T, with T denoting the minimum length between transition, are generated in a waveform string corresponding to continuation of two identical codes, the waveform string being produced by NRZI modulating a code series of continuous codes each code being a code having CDS after NRZI modulation equal to 0, ±2 of (0,9;8,10;1) code, and then by NRZI modulating the code series of continuous codes, the reproducing method comprising the steps of: equalizing by partial response class 1 a reproduction signal reproduced from the recording medium; Viterbi decoding the equalized reproduction signal to generate a waveform string; NRZI demodulating the resulting waveform string to generate a code series; and transforming each 10-bit code of the resulting code series to 8-bit data for reproduction from the recording medium.

According to the present invention, there is provided a reproducing method for a recording medium having recorded therein a waveform string produced by transforming 8-bit data to a 10-bit code using a code other than a code such that lengths between transition 1T, 4T, 1T, 3T, 1T, or 1T, 3T, 1T, 4T, 1T, with T denoting the minimum length between transition, are generated in a waveform string corresponding to continuation of two identical codes, the waveform string being produced NRZI modulating a code series of continuous codes, each code being a code having CDS after NRZI modulation equal to 0, ±2 of (0,9;8,10;1) code, with number of continuous 1's being not greater than N, N being 12 to 18, in the code series, and then by NRZI modulating the code series of continuous codes, the reproducing method comprising the steps of: equalizing by partial response class 1 a reproduction signal reproduced from the recording medium; Viterbi decoding the equalized reproduction signal to generate a waveform string; NRZI demodulating the resulting waveform string to generate a code series; and transforming each 10-bit code of the resulting code series to 8-bit data for reproduction from the recording medium.

According to the present invention, there is also provided a recording and reproducing apparatus comprising: transform means for transforming 8-bit data to a 10-bit code, using a code other than a code such that lengths between transition 1T, 4T, 1T, 3T, 1T, or 1T, 3T, 1T, 4T, 1T, with T denoting the minimum length between transition, are generated in a waveform string corresponding to continuation of two identical codes, the waveform string being produced by NRZI modulating a code series of continuous codes, each code being a code having CDS after NRZI modulation equal to 0, ±2 of (0,3;8,10;1) code, with the number of continuous 1's being not greater than N, N being 12 to 18, in the code series; NRZI modulation means for NRZI modulating the code series from the transform means to generate a waveform string; recording means for recording the waveform string from the NRZI modulation means into a recording medium; reproducing means for reproducing a signal from the recording medium; equalizing means for equalizing a reproduction signal from the reproducing means by partial response class 1; Viterbi decoding means for Viterbi decoding the reproduction signal equalized by the equalizing means to generate a waveform string; NRZI demodulation means for NRZI demodulating the waveform string from the Viterbi decoding means to generate a code series; and decoding means for transforming each 10-bit code of the code series from the NRZI demodulation means to 8-bit data.

According to the present invention, there is a recording and a recording and reproducing method comprising the steps of: transforming 8-bit data to a 10-bit code, using a code other than a code such that lengths between transition 1T, 4T, 1T, 3T, 1T, or 1T, 3T, 1T, 4T, 1T, with T denoting the minimum length between transition, are generated in a waveform string corresponding to continuation of two identical codes, the waveform string being produced by NRZI modulating a code series of continuous codes, each code being a code having CDS after NRZI modulation equal to 0, ±2 of (0,3;8,10;1) code, with the number of continuous 1's being not greater than N, N being 12 to 18, in the code series; NRZI modulating the transformed code series to generate a waveform string; recording the resulting waveform string into a recording medium; reproducing a signal from the recording medium; equalizing a reproduction signal reproduced from the recording medium by partial response class 1; Viterbi decoding the equalized reproduction signal to generate a waveform string; NRZI demodulating the Viterbi decoded waveform string to generate a code series; and transforming each 10-bit code of the NRZI demodulated code series to 8-bit data.

According to the present invention, there is also provided a reproducing apparatus for a recording medium comprising: reproducing means for reproducing a signal from a recording medium loaded in the apparatus and outputting a reproduction signal; first equalizing means for equalizing the reproduction signal from the reproducing means by partial response class 1; Viterbi decoding means for Viterbi decoding the reproduction signal equalized by the first equalizing means to reproduce a waveform string; second equalizing means for integral equalizing the reproduction signal from the reproducing means; binary coding means for binary coding the reproduction signal equalized by the second equalizing means to reproduce a waveform string; switching means for selecting by switch the waveform string from the Viterbi decoding means and the waveform string from the binary coding means; NRZI demodulation means for NRZI demodulating the waveform string selected by the switching means to reproduce a code series; and control means for detecting density of the recording medium loaded in the apparatus and controlling the switching means to select the waveform string from the Viterbi decoding means when detection results show that the density of the recording medium is high, and to select the waveform string from the binary coding means when the detection results show that the density of the recording medium is low.

Also, in the reproducing apparatus for a recording medium according to the present invention, the recording medium is housed in a cartridge, the cartridge having an identification part for identifying recording density of the recording medium housed therein.

In addition, in the reproducing apparatus for a recording medium according to the present invention, the recording medium is a tape-like recording medium housed in a cartridge having an identification part for showing linear recording density of the tape-like recording medium.

The reproducing apparatus for a recording medium according to the present invention further comprises clock reproducing means selectively supplied with the waveform string from the first or second equalizing means by the switching means and adapted for reproducing a channel clock on the basis of the supplied waveform string.

Thus, in the present invention, 8-bit data is transformed to a 10-bit code, using only a code having CDS after NRZI modulation equal to 0, ±2 of (0,3;8,10;1) code and having the number of continuous 1's in a code series of continuous codes not greater than N, with N being 12 to 18. Then, the code series of continuous codes is NRZI modulated and recorded into the recording medium. Thus, a code having shorter continuation of 1's than in the conventional 8-10 modulation is employed in reproducing signals from the recording medium through equalization by partial response class 1 and Viterbi decoding. Therefore, continuation of 0's of the equalized waveform can be shortened, and the threshold value for discriminating the equalized waveform can be stably determined. Thus, the error rate can be lowered in comparison with the conventional data recorder. Also, as a code having shorter continuation of 1's is employed, data determination in maximum likelihood decoding can be easily carried out, that is, the memory can be reduced, and the circuit of the Viterbi decoder can be simplified. In addition, as the partial response technique to control the quantity of intersymbol interference is employed, the linear recording density can be increased in comparison with DAT and the conventional data recorder.

In addition, in the present invention, 8-bit data is transformed to a 10-bit code, using a code having CDS after NRZI modulation equal to 0, ±2 of (0,3;8,10;1) code and other than codes in which lengths between transition 1T, 4T, 1T, 3T, 1T, or 1T, 3T, 1T, 4T, 1T, with T denoting the minimum length between transition, are generated in a waveform string corresponding to continuation of two identical codes, produced by NRZI modulating a code series of continuous codes. Then, the code series of continuous codes is NRZI modulated and recorded into the recording medium. Thus, as a code of large peak shift is not employed in reproducing signals from the recording medium through equalization by partial response class 1 and Viterbi decoding, the error rate can be lowered in comparison with the conventional data recorder. Also, as the partial response technique to control the quantity of intersymbol interference is employed, the linear recording density can be increased in comparison with DAT and the conventional data recorder.

Further, in the present invention, the linear recording density of the magnetic recording medium in the cartridge is detected based on the identification part provided on the cartridge. With the cartridge of high linear recording density, the reproduction signal is equalized by partial response class 1 and Viterbi decoded, so that the waveform string is reproduced. With the cartridge of low linear recording density, the reproduction signal is integral equalized and binary coded, so that the waveform string is reproduced for reproduction from the magnetic recording medium. Thus, data can be reproduced automatically both from the conventional cartridge of high linear recording density and the cartridge of low linear recording density.

BRIEF DESCRIPTION OF THE DRAWINGS

FIG. 1 is a view showing part of a DDS2 code table in the conventional 8–10 modulation.

FIG. 2 is a view showing part of the DDS2 code table in the conventional 8–10 modulation.

FIG. 3 is a view showing part of the DDS2 code table in the conventional 8–10 modulation.

FIG. 4 is a view showing part of the DDS2 code table in the conventional 8–10 modulation.

FIG. 5 is a view showing part of the DDS2 code table in the conventional 8–10 modulation.

FIG. 6 is a view showing part of the DDS2 code table in the conventional 8–10 modulation.

FIG. 7 is a view showing part of the DDS2 code table in the conventional 8–10 modulation.

FIG. 11 is a view showing a code having long continuation of 1's.

FIG. 12 is a view showing a code which is not used in the conventional 8–10 modulation.

FIG. 13 is a view showing a code having a high error rate.

FIG. 14 is a view showing part of a specific code table in 8–10 modulation according to the present invention.

FIG. 15 is a view showing part of the specific code table in the 8–10 modulation according to the present invention.

FIG. 16 is a view showing part of the specific code table in the 8–10 modulation according to the present invention.

FIG. 17 is a view showing part of the specific code table in the 8–10 modulation according to the present invention FIG. 18 is a view showing part of the specific code table in the 8–10 modulation according to the present invention.

FIG. 19 is a view showing part of the specific code table in the 8–10 modulation according to the present invention.

FIG. 20 is a view showing part of the specific code table in the 8–10 modulation according to the present invention.

FIG. 21 is a view showing other specific codes in the 8–10 modulation according to the present invention.

FIG 22 is a view showing other specific codes in the 8–10 modulation according to the present invention.

DESCRIPTION OF THE PREFERRED EMBODIMENTS

Preferred embodiments of the modulation method, the recording method, the reproducing method, the recording and reproducing apparatus, the recording and reproducing method, and the reproducing apparatus will now be described with reference to the attached drawings. In the present embodiment, the present invention is applied to a data recorder for storing data from an information processing device on a magnetic tape as a recording medium, with the linear recording density along tracks set to 122 kbps, which is twice that of the digital audio tape recorder (DAT) or the conventional data recorder.

Figure 8:
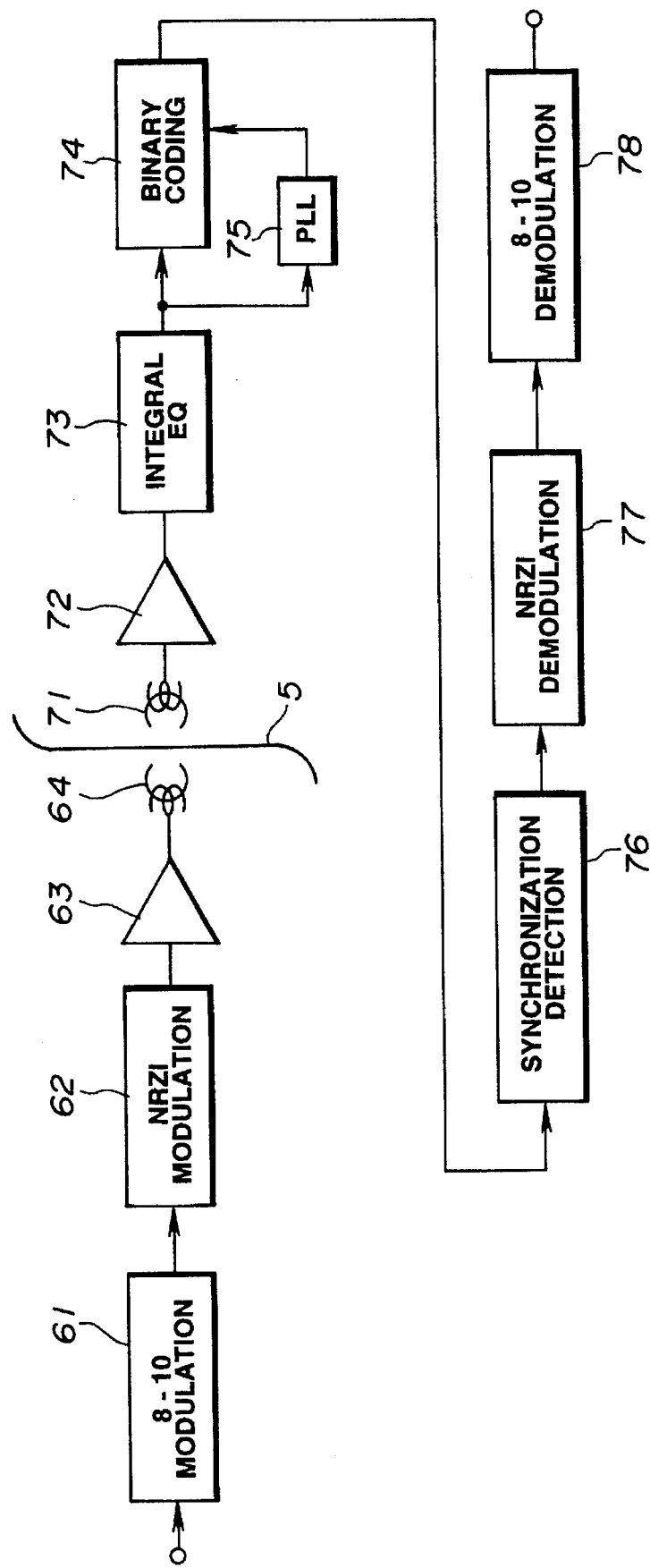
FIG. 8 is a block diagram showing the structure of a conventional data recorder.
Figure 9:
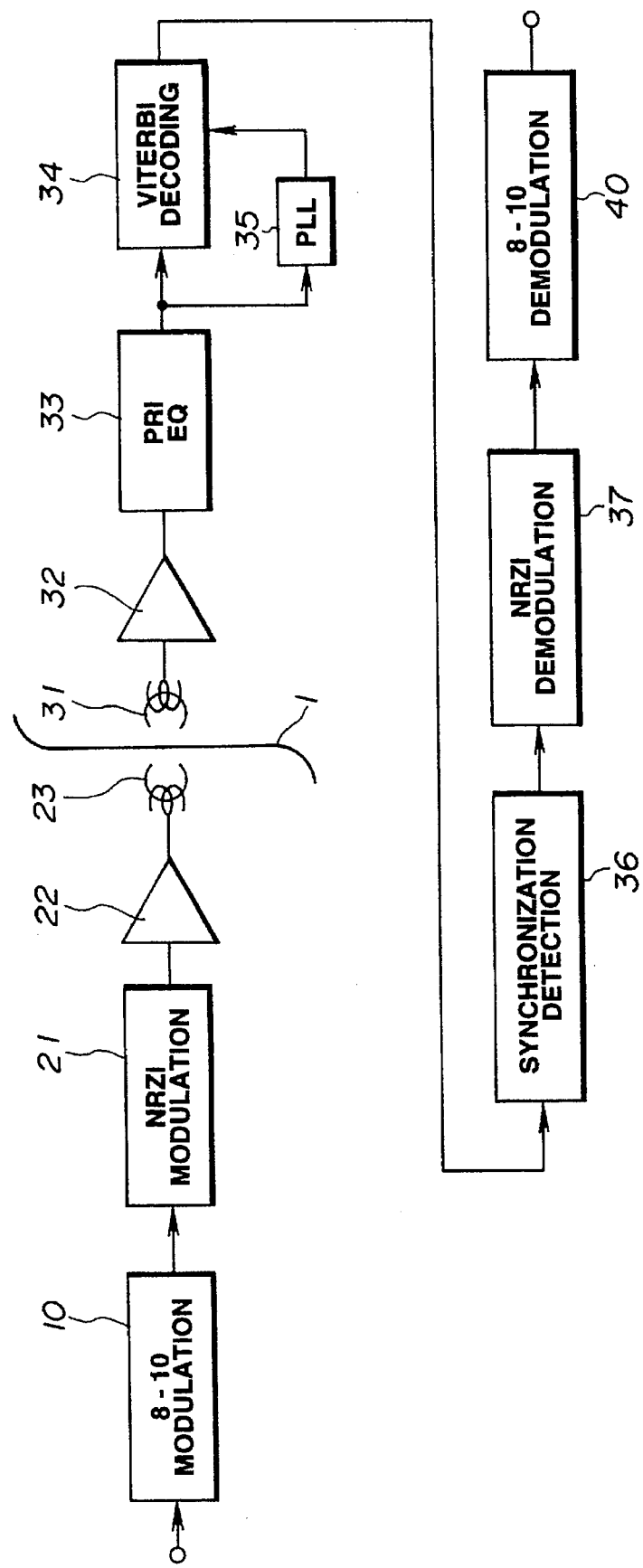
FIG. 9 is a block diagram showing the specific structure of a data recorder according to the present invention.

The data recorder according to the present invention has, as essential portions of a recording system thereof, an 8–10 modulator 10 for transforming 8-bit data to a 10-bit code, an NRZI modulator 21 for NRZI modulating a code series of continuous codes from the 8–10 modulator to generate a waveform string, an amplifier 22 for amplifying the waveform string from the NRZI modulator 21, and a rotary head 23 for carrying out recording onto a magnetic tape 1 on the basis of the waveform string amplified by the amplifier 22, as shown in FIG. 9.

The 8–10 modulator 10 transforms 8-bit data to a 10-bit code, using a code having so-called CDS after NRZI modulation equal to 0, ±2 of (0,3;8,10;1) code, and having the number of continuous 1's in a code series of continuous codes not greater than N (N=12 to 18), other than code in which lengths between transition 1T, 4T, 1T, 3T, 1T, or 1T, 3T, 1T, 4T, 1T (T denoting the minimum length between transition) are generated in a waveform string corresponding to continuation of two identical codes, produced by NRZI modulating the code series.

The NRZI modulator 21 functions as a so-called precoder corresponding to equalization by partial response class 1 in a reproducing system, as will be described later. The NRZI modulator 21 NRZI modulates the code series supplied from the 8–10 modulator 10 to generate a waveform string, and supplies the resulting waveform string through the amplifier 22 to the rotary head 23. Thus, data supplied from an information processing device, such as, a personal computer or a work station, is recorded onto the magnetic tape 1 as inversion of magnetization polarity by a so-called helical scan.

Figure 10:
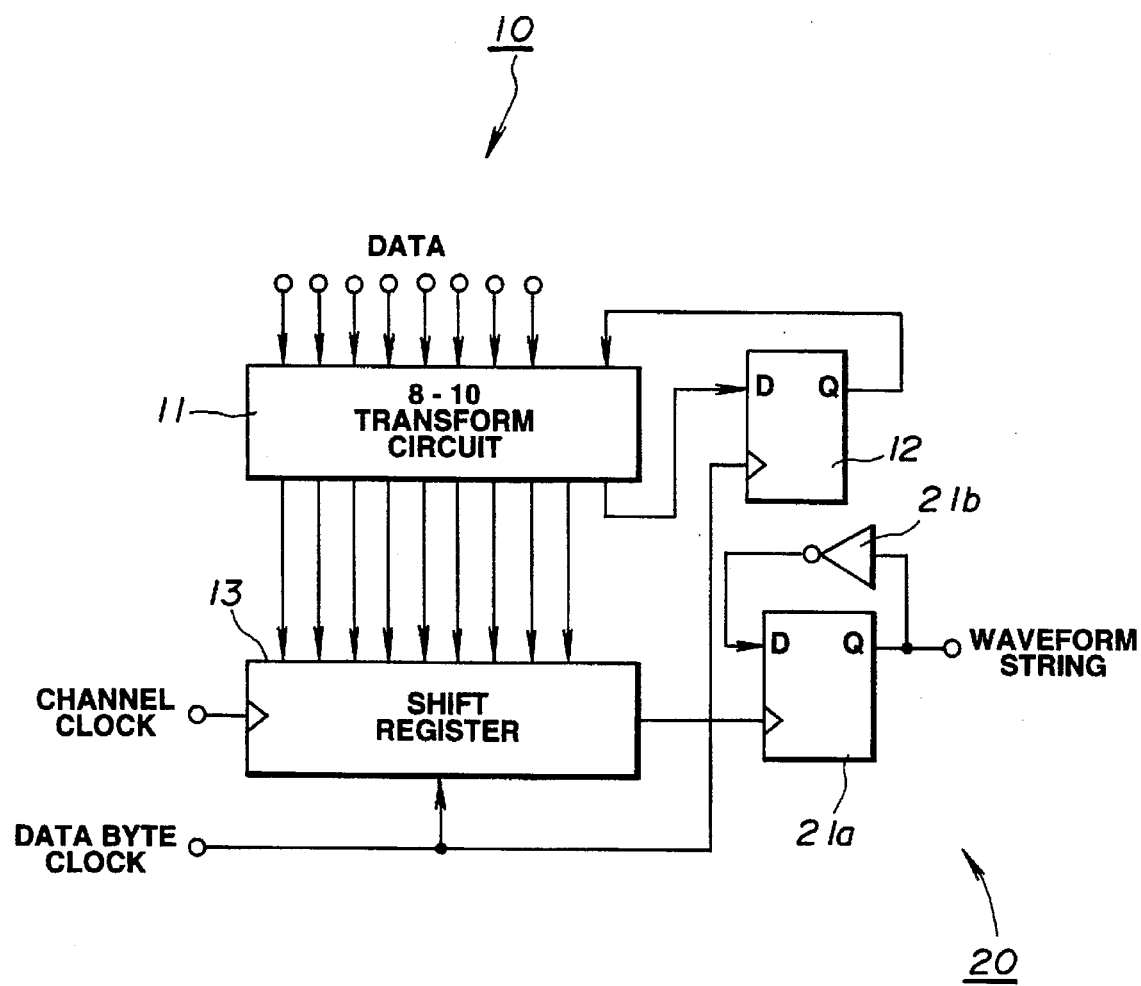
FIG. 10 is a view showing the circuit structure of an 8–10 modulator of the data recorder.

In further detail, the 8–10 modulator 10 has an 8–10 transform circuit 11 for transforming 8-bit data to a 10-bit code, a flipflop (FF) 12 for storing so-called DSV, and a shift register 13 for transforming to serial data the code supplied as parallel data from the 8–10 transform circuit 11, as shown in FIG. 10.

The 8–10 transform circuit 11, composed of a logical circuit functioning as a code table as will be later described, transforms 8-bit data to a 10-bit code on the basis of a DSV value Q' supplied from the FF 12 for the codes up to the code previously outputted. The 8–10 transform circuit 11 supplies the 10-bit code to the shift register 13, and supplies a DSV value Q for the codes up to the corresponding code to the FF 12.

The shift register 13 loads the 10-bit code supplied as parallel data from the 8–10 transform circuit 11, by a data byte clock indicating a delimiter of data, and then shifts the code every one bit on the basis of the channel clock, to supply the code to the NRZI modulator The NRZI modulator 21 has an FF 21a for operating with the code from the shift register as a clock, and an inverter circuit 21b inverting the output of the FF 21a to use the inverted output as an input thereto, as shown in FIG. 10. The FF 21a, when supplied with 1, inverts its output, that is, NRZI modulates the code supplied continuously from the shift register 13 to generate the waveform string.

The 8–10 transform circuit 11 will now be described in detail.

The 8–10 transform circuit 11 transforms 8-bit data to a 10-bit code in accordance with a code table composed of a code which has CDS as a value obtained by subtracting the number of 0's from the number of 1's of the NRZI modulated code, that is, DSV per code equal to 0, ±2, and in which the number of continuous 1's is not greater than N (N=12 to 18), of (0,3;8,10;1) code for transforming 8-bit data to 10-bit code with a so-called minimum run d of 0 equal to 0 and a maximum run k of 0 equal to 3.

That is, the 8–10 transform circuit 11 employs the code table in which codes "1111111111", "0111111111" and "1111111110" causing long continuation of 1's and allocated to data "11101011" (data EB), "00101011" and "11111110" as shown in FIG. 11 in the code table (DDS2 code table) conventionally used in the data recorder, as shown in FIGS. 1 to 7, are replaced by 15 codes, such as, codes "0111001001", "0111001011", "0111001110" and the like not used in the DDS2 code table, as shown in FIG. 12. In FIG. 12, the value indicated by Q is a DSV value for the codes up to the corresponding code, and the value indicated by Q' is a DSV value for the codes up to a code preceding the corresponding code. One of two codes allocated to one data is selected by so-called LDC. The codes having long continuation of 1's of the codes shown in FIG. 11 are replaced by codes having the number of continuous 1's not greater than N, in the sequence starting with the code of the longest continuation of 1's.

However, a code having a high error rate causing a greater peak shift than other codes is included in the code table having the number of continuous 1's not greater than N, as described above. Thus, the 8–10 transform circuit 11 transforms 8-bit data to a 10-bit code, using a code other than codes in which lengths between transition 1T, 4T, 1T, 3T, 1T, or 1T, 3T, 1T, 4T, 1T (T denoting the minimum length between transition) are generated in a waveform string corresponding to continuation of two identical codes, with the waveform string produced by NRZI modulating the code series.

That is, codes "1011001110", "0011001110", "1110001110" and "0110001110" allocated to data A6 and C6, if consecutively appearing twice, generate lengths between transition 1T, 4T, 1T, 3T, 1T, or 1T, 3T, 1T, 4T, 1T in the waveform string, as shown in FIG. 13. The 8–10 transform circuit 11 uses the code table in which these codes are replaced by the codes (as shown in FIG. 12) not used in the DDS2 code table. The 8–10 transform circuit 11 also uses a code table in which codes of high error rate other than the above-mentioned codes "1011001110", "0011001110", "1110001110" and "0110001110", such as, codes "0010110110", "1010110110", "1011011010" and "0011011010" allocated to data "76", "A7" . . . , are replaced by codes not used in the DDS2 code table, as shown in FIG. 13.

The number of replaceable codes is 15 as described above. However, as a code of high error rate is included in these 15 codes, the total number of the codes for preventing continuation of 1's and the codes for lowered the error rate is necessarily limited. Thus, the 8–10 transform circuit 11 uses a code table as shown in FIGS. 14 to 20, in which code "1111111111" allocated to data EB in the DDS2 code table is replaced by code "0111001001", codes "1110001110" and "0110001110" allocated to data C6 replaced by code "0111001011", codes "1011001110" and "0011001110" allocated to data A6 replaced by code "0111001110", code "0111111111" allocated to data 2B replaced by code "0010011011" or "1010011011", codes "1111111110" and "0111111110" allocated to data FE replaced by codes "1100100110" and "0100100110", codes "1011111111" and "0011111111" allocated to data AB replaced by codes "1110110010" and "0110110010", codes "1111111101" allocated to data EA replaced by "1011110010" or "0011110010", codes "1110001011" and "0110001011" allocated to data C5 replaced by codes "1100100011" and "0100100011", codes "0010110110" and "1010110110" allocated to data "76" replaced by codes "0010011110" and "1010011110", so that the number of continuous 1's is not greater than 14 (N=14). Allocation of codes to data is not limited to the relation shown in FIGS. 14 to 20, and various combinations can be made arbitrarily.

The code table as shown in FIGS. 14 to 20 is only a specific example. Therefore, a code table may be employed in which, for example, the number of continuous 1's is not greater than 18 (N=18), and in which code "0010011110" or "1010011110" is allocated to data EB, code "1011110010" or "0011110010" to data A6, code "1100100011" or "0100100011" to data C6, code "1100100110" or "0100100110" to code 76, code "0010011011" or "1010011011" to data A7, code "1110110010" or "0110110010" to data C5, code "0111001110" to data "47", code "0111001011" to data 74, and code "0111001001" to data C7 in the DDS2 code table, as shown in FIG. 21.

Also, a code table may be employed in which, for example, the number of continuous 1s is 16 (N=16), and in which code "0010011001" or "1010011001" is allocated to data EB, code "0010011110" or "1010011110" to data EB, A6, code "1011110010" or or "0011110010" to data C6, code "1100100011" or "0100100011" to data 2B, code "1100100110" or "0100100110" to data FE, code "0010011011" or "1010011011" to data 76, code "1110110010" or "0110110010" to data A7, code "0111001110" to data C5, code "0111001011" to data 47, and code "0111001001" to data 74 in the DDS2 code table, as shown in FIG. 22.

Figures 23, 24:
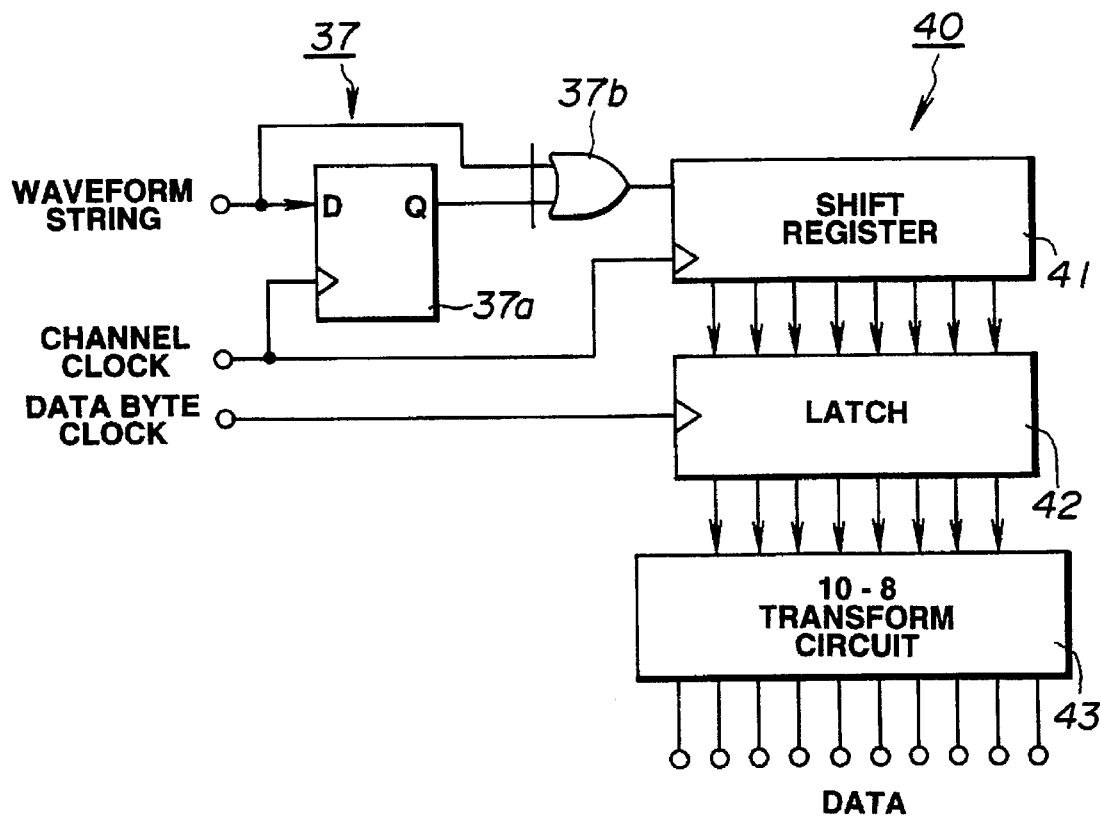
FIG 23 is a view showing other specific codes in the 8–10 modulation according to the present invention.
FIG. 24 is a view showing the specific circuit configuration of an 8–10 demodulator of the data recorder.

Also, a code table may be employed in which, for example, the number of continuous 1's is 14 (N=14), and in which code "0110100110" or "1110100110" is allocated to data EB, code "0010011001" or "1010011001" to data A6, code "0100110010" or "1100110010" to data C6, code "0010011110" or "1010011110" to data 2B, code "1011110010" or "0011110010" to data FE, code "1100100011" or "0100100011" to data AB, code "1100100110" or "0100100110" to data EA, code "0010011011" or "1010011011" to data 76, code "1110110010" or "0110110010" to data "A7", code "0111001110" to data C5, code "0111001011" to data 47, and code "0111001001" to data 74 in the DDS2 code table, as shown in FIG. 23.

In addition, a code table may be employed in which, for example, the number of continuous 1's is 12 (N=12), and in which code "0110100110" or "1110100110" is allocated to data EB, code "0010011001" or "1010011001" to data A6, code "0100110010" or "1100110010" to data C6, code "0010011110" or "1010011110" to data 2B, code "1011110010" or "0011110010" to data FE, code "1100100011" or "0100100011" to data AB, code "1100100110" or "0100100110" to data EA, code "0010011011" or "1010011011" to data 0B, code "1110110010" or "0110110010" to data B3, code "0111001110" to data EF, code "0111001011" to data FC, and code "0111001001" to data FD in the DDS2 code table.

The reproducing system of the data recorder will now be described.

The data recorder has, as essential portions of its reproducing system, a rotary head 31 for reproducing a signal from the magnetic tape 1 and outputting a reproduction signal, an amplifier 32 for amplifying the reproduction signal from the rotary head 31, a PR1 equalizer 33 for equalizing by partial response class 1 the reproduction signal amplified by the amplifier 32, a Viterbi decoder 34 for Viterbi decoding the reproduction signal equalized by the PR1 equalizer 33 (hereinafter referred to as an equalized waveform) and reproducing a waveform string, a phase locked loop (PLL) 35 for reproducing a channel clock based on the equalized waveform from the PR1 equalizer 33, a synchronization detection circuit 36 for detecting a synchronization signal from the waveform string from the Viterbi decoder 34, an NRZI demodulator 37 for NRZI demodulating the waveform string from the Viterbi decoder 34 and reproducing a code series, and an 8–10 demodulator 40 corresponding to the 8–10 modulator 10, for transforming each code of the code series from the NRZI demodulator 37 to data, as shown in FIG. 9.

The rotary head 31 outputs a ternary reproduction signal as a differential signal of magnetization polarity inversion of the magnetic tape 1. The amplifier 32 amplifies this reproduction signal and supplies the resulting signal to the PR1 equalizer 33.

The PR1 equalizer 33 equalizes the reproduction signal by partial response class 1, and supplies the equalized waveform having continuous 0's for a code of continuous 1's (that is, a so-called eye pattern) to the Viterbi decoder 34. The Viterbi decoder 34 discriminates the equalized waveform using a threshold value obtained from an envelope of the equalized waveform, and carries out so-called maximum likelihood decoding, to reproduce the waveform string. That is, as the 8–10 modulator 10 in the recording system transforms data to a code of shorter continuation of 1's than in 8–10 modulation by the conventional data recorder, continuation of 0's in the equalized waveform can be shortened, and the threshold value for discriminating the equalized waveform can be stably determined. Thus, the error rate can be reduced in comparison with the conventional data recorder. In addition, as the code of shorter continuation of 1's is used, data can be easily determined in the maximum likelihood decoding, that is, the memory can be reduced, and the circuit of the Viterbi decoder 34 can be simplified.

As is described above, the 8–10 modulator 10 of the recording system does not use a code of large peak shift in which lengths between transition 1T, 4T, 1T, 3T, 1T, or 1T, 3T, 1T, 4T, 1T are generated in the waveform string corresponding to continuation of two identical codes. Therefore, the error rate can be reduced in comparison with the conventional data recorder.

The PLL 35 reproduces the channel clock on the basis of the equalized waveform supplied from the PR1 equalizer 33, and supplies the channel clock to the Viterbi decoder 34. The synchronization detection circuit 36 detects a synchronization signal from the waveform string supplied from the Viterbi decoder 34, and supplies a data byte clock indicating a delimiter of codes or data to the 8–10 demodulator 40. The NRZI demodulator 37 has an FF 37a for sequentially storing the waveform string from the Viterbi demodulator 34 every one bit, and an exclusive OR (EXOR) circuit 37b, as shown in FIG. 24. The FF 37a sequentially stores the waveform string every one bit by the channel clock supplied from the PLL 35, to delay the waveform string by an amount of one channel clock. The EXOR circuit 37b finds the exclusive OR of the bits preceding and succeeding the waveform string, thereby NRZI demodulating the waveform string to reproduce the code series. The EXOR circuit 37b then supplies the code series to the 8–10 demodulator 40.

The 8–10 demodulator 40 has a shift register 41 for separating each code from the code series supplied from the EXOR circuit 37b, a latch circuit 42 for latching the code from the shift register 41, and a 10-8 transform circuit 43 for transforming the 10-bit code from the latch circuit 42 to 8-bit data, as shown in FIG. 24.

The shift register 41, operating on the basis of the channel clock supplied from the PLL 35, separates each code from the code series supplied as serial data from the EXOR circuit 37b, to supply the resulting code as parallel data to the latch circuit 42. The latch circuit 42 latches the 10-bit code on the basis of the data byte clock supplied from the synchronization detection circuit 36.

The 10-8 transform circuit 43 is composed of a logical circuit for carrying out the reverse of the processing by the 8–10 transform circuit 11. The 10-8 transform circuit 43 transforms the 10-bit code supplied from the latch circuit 42 to 8-bit data. Thus, data is reproduced from the magnetic tape 1.

As is clear from the above description, the data recorder employs the partial response technique for controlling the quantity of intersymbol interference. Thus, the linear recording density can be increased in comparison with the DAT or the conventional data recorder. In the above-described embodiment, the linear recording density is increased to twice that of the conventional example. However, the linear recording density is not limited to twice the conventional level, and may be (M+1)/M, with M=1, 2, 3, . . .

A data recorder capable of reproducing data both from a magnetic tape having the conventional linear recording density of 61 kbps, and from a magnetic tape having a higher linear recording density of 122 kbps, for example, will now be described. The circuit identical to that in the reproducing system of the above-described data recorder is denoted by the same reference numeral and will not be described further in detail.

Figure 25:
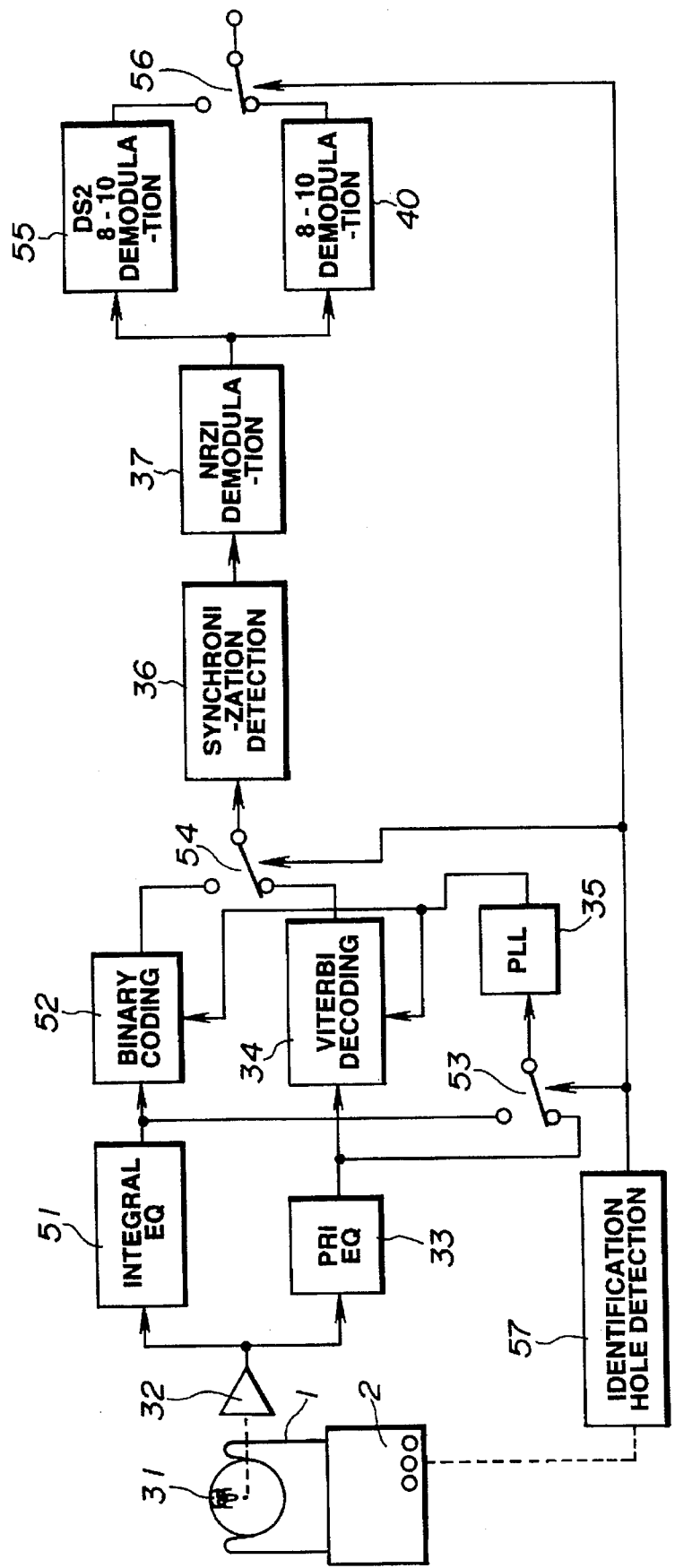
FIG. 25 is a block diagram showing the specific structure of a reproducing system of the data recorder according to the present invention.

The data recorder has, as essential portions of its reproducing system in addition to the components from the rotary head 31 to the 8–10 demodulator 40, an integral equalizer 51 for integral equalizing the reproduction signal amplified by the amplifier 32, a binary coding circuit 52 for binary coding the equalized waveform from the integral equalizer 51 and reproducing the waveform string, a switch 53 for selecting by switch the equalized waveform from the integral equalizer 51 or the PR1 equalizer 33 and supplying the selected equalized waveform to the PLL 35, a switch 54 for selecting by switch the waveform string from the binary coding circuit 52 or the Viterbi decoder 34, an 8–10 demodulator (DDS2 demodulator) 55 used in the conventional data recorder, a switch 56 for selecting by switch the data from the DDS2, demodulator 55 or the 8–10 demodulator 40, and an identification hole detection circuit 57 for detecting the linear recording density of the magnetic tape 1 on the basis of an identification hole 3 for identifying the linear recording density provided on a cartridge 2 of the magnetic tape 1, and controlling the switches 53, 54 and 56 on the basis of detection results, as shown in FIG. 25.

The integral equalizer 51 integrally equalizes the reproduction signal supplied from the amplifier 32. The binary coding circuit 52 binary coding the equalized waveform. The DDS2 demodulator 55 transforms the 10-bit code supplied from the NRZI demodulator 37 to 8-bit data on the basis of the conventional DDS2 code table as shown in FIGS. 1 to 7.

The identification hole detection circuit 57 determines, on the basis of the identification hole 3, whether the loaded cartridge 2 is for the linear recording density of 61 Kbpi, or 122 Kbps. The identification hole detection circuit 57 controls the switch 53 to select the equalized waveform from the PR1 equalizer 33, the switch 54 to select the waveform string from the Viterbi decoder 34 and the switch 56 to select the data from the 8–10 demodulator 40, when the linear recording density is 122 Kbpi. On the other hand, the identification hole detection circuit 57 controls the switch 53 to select the equalized waveform from the integral equalizer 51, the switch 54 to select the waveform string from the binary coding circuit 52 and the switch 56 to select the data from the DDS2 demodulator 55, when the linear recording density is 61 Kbpi.

The PLL 35 reproduces a channel clock of a frequency corresponding to the linear recording density. The Viterbi decoder 34, the 8–10 demodulator 40, the binary coding circuit 52 and the DDS2 demodulator 55 operate with corresponding channel clocks.

Thus, with this data recorder, data can be automatically reproduced both from the conventional cartridge 2 of low linear recording density and from the cartridge 2 of higher linear recording density.

It is to be understood that the present invention is not limited to the above-described embodiment, and may be applied to, for example, an optical disc device using an optical disc as a recording medium. Also, though the code table is realized by the logical circuit in the above embodiment, the code table may be constituted by a read-only memory (ROM). That is, codes may be read out of the ROM using the data as a readout address.

What is claimed is:

1. A modulation method for transforming data to a code using a code having a codeword digital sum after NRZI modulation equal to 0, ±2 of (0,3;8,10;1) code, the method comprising steps of:

selecting a code such that the number of continuous 1's in a series employing the selected code successively is not greater than N, N being 12 to 18 ; and transforming 8-bit data to a 10-bit code using only the selected code.

2. A modulation method for transforming data to a code using a code having a codeword digital sum after NRZI modulation equal to 0, ±2 of (0,3;8,10;1) code, the method comprising steps of:

generating a waveform string corresponding to two successive, identical codes by NRZI modulating a code series of continuous codes by selecting a code other than a code such that lengths between transition 1T, 4T, 1T, 3T, 1T, or 1T, 3T, 1T, 4T, 1T, T denoting a minimum length between transition, are generated; and transforming 8-bit data to a 10-bit code using only the selected code.

3. A modulation method for transforming data to a code using a code having a codeword digital sum after NRZI modulation equal to 0, ±2 of (0,3;8,10;1) code, the method comprising steps of:

generating a waveform string corresponding to two successive, identical codes by NRZI modulating a code series of continuous codes by selecting a code other than a code such that lengths between transition 1T, 4T, 1T, 3T, 1T, or 1T, 3T, 1T, 4T, 1T, T denoting a minimum length between transition, are generated, with the number of continuous 1's being not greater than N, with N being 12 to 18, in the code series; and transforming 8-bit data to a 10-bit code using only the selected code.

4. A recording method for a recording medium comprising steps of:

selecting a code such that the number of continuous 1's in a series employing the selected code successively is not greater than N, N being 12 to 18, each code being a code having a codeword digital sum after NRZI modulation equal to 0, ±2 of (0,3;8,10;1) code;

transforming 8-bit data to a 10-bit code using only the selected code;

NRZI modulating the transformed code series to generate a waveform string; and recording the resulting waveform string into the recording medium.

5. A recording method for a recording medium comprising steps of:

generating a waveform string corresponding to two successive, identical codes from a code series of continuous codes, each code having a codeword digital sum by NRZI modulating equal to 0, ±2 of (0,3;8,10;1) code, by selecting a code other than a code such that lengths between transition 1T, 4T, 1T, 3T, 1T, or 1T, 3T, 1T, 4T, 1T, T denoting a minimum length between transition, are generated;

transforming 8-bit data to a 10-bit code using only the selected code; NRZI modulating the transformed code series to generate a waveform string; and recording the resulting waveform string into the recording medium.

6. A recording method for a recording medium comprising steps of:

generating a waveform string corresponding to two successive, identical codes from a code series of continuous codes, each code having a codeword digital sum after NRZI modulating equal to 0, ±2 of (0,3;8,10;1) code, by selecting a code other than a code such that lengths between transition 1T, 4T, 1T, 3T, 1T, or 1T, 3T, 1T, 4T, 1T, T denoting a minimum length between transition, are generated, with the number of continuous 1's being not greater than N, N being 12 to 18, in the code series;

transforming 8-bit data to a 10-bit code using only the selected code;

NRZI modulating the transformed code series to generate a waveform string; and recording the resulting waveform string into the recording medium.

7. A reproducing method for a recording medium having a waveform string recorded therein, the waveform string being produced by transforming 8-bit data to a 10-bit code using only a code such that the number of continuous 1's in a series employing the selected code successively is not greater than N, N being 12 to 18, in a code series of continuous codes, each code being a code having a codeword digital sum after NRZI modulation equal to 0, ±2 of (0,3;8,10;1) code, and then NRZI modulating the code series of continuous codes, the reproducing method comprising steps of:

equalizing by partial response class 1 a reproduction signal reproduced from the recording medium;

Viterbi decoding the equalized reproduction signal to generate a waveform string;

NRZI demodulating the resulting waveform string to generate a code series; and transforming each 10-bit code of the resulting code series to 8-bit data for reproduction from the recording medium.

8. A reproducing method for a recording medium having a waveform string recorded therein, the waveform string being produced by transforming 8-bit data to a 10-bit code using only a code other than a code such that lengths between transition 1T, 4T, 1T, 3T, 1T, or 1T, 3T, 1T, 4T, 1T, T denoting a minimum length between transition, are generated in a waveform string corresponding to two successive, identical codes, the waveform string being produced by NRZI modulating a code series of continuous codes, each code being a code having a codeword digital sum after NRZI modulation equal to 0, ±2 of (0,3;8,10;1) code, and then NRZI modulating the code series of continuous codes, the reproducing method comprising steps of:

equalizing by partial response class 1 a reproduction signal reproduced from the recording medium;

Viterbi decoding the equalized reproduction signal to generate a waveform string;

NRZI demodulating the resulting waveform string to generate a code series; and transforming each 10-bit code of the resulting code series to 8-bit data for reproduction from the recording medium.

9. A reproducing method for a recording medium having recorded therein a waveform string produced by transforming 8-bit data to a 10-bit code using only a code other than a code such that lengths between transition 1T, 4T, 1T, 3T, 1T, or 1T, 3T, 1T, 4T, 1T, with T denoting a minimum length between transition, are generated in a waveform string corresponding to two successive, identical codes, the waveform string being produced by NRZI modulating a code series of continuous codes, each code being a code having a codeword digital sum after NRZI modulation equal to 0, ±2 of (0,3;8,10;1) code, with number of continuous 1's being not greater than N, N being 12 to 18, in the code series, and then NRZI modulating the code series of continuous codes, the reproducing method comprising steps of:

equalizing by partial response class 1 a reproduction signal reproduced from the recording medium;

Viterbi decoding the equalized reproduction signal to generate a waveform string;

NRZI demodulating the resulting waveform string to generate a code series; and transforming each 10-bit code of the resulting code series to 8-bit data for reproduction from the recording medium.

10. A recording and reproducing apparatus comprising:

transform means for transforming 8-bit data to a 10-bit code, using only a code other than a code such that lengths between transition 1T, 4T, 1T, 3T, 1T, or 1T, 3T, 1T, 4T, 1T, T denoting a minimum length between transition, are generated in a waveform string corresponding to two successive, identical codes, the waveform string being produced by NRZI modulating a code series of continuous codes, each code being a code having a codeword digital sum after NRZI modulation equal to 0, ±2 of (0,3;8,10;1) code, with the number of continuous 1's being not greater than N, N being 12 to 18, in the code series;

NRZI modulation means for NRZI modulating the code series from the transform means to generate a waveform string;

recording means for recording the waveform string from the NRZI modulation means into a recording medium;

reproducing means for reproducing a signal from the recording medium;

equalizing means for equalizing a reproduction signal from the reproducing means by partial response class 1;

Viterbi decoding means for Viterbi decoding the reproduction signal equalized by the equalizing means to generate a waveform string;

NRZI demodulation means for NRZI demodulating the waveform string from the Viterbi decoding means to generate a code series; and decoding means for transforming each 10-bit code of the code series from the NRZI demodulation means to 8-bit data.

11. A recording and reproducing method comprising steps of:

generating a waveform string corresponding to two successive, identical codes from a code series of continuous codes, each code having a codeword digital sum after NRZI modulating equal to 0, ±2 of (0,3;8,10;1) code, by selecting a code other than a code such that lengths between transition 1T, 4T, 1T, 3T, 1T, or 1T, 3T, 1T, 4T, 1T, T denoting a minimum length between transition, with the number of continuous 1's being not greater than N, N being 12 to 18, in the code series;

transforming 8-bit data to a 10-bit code using only the selected code;

NRZI modulating the transformed code series to generate a waveform string;

recording the resulting waveform string into a recording medium;

reproducing a signal from the recording medium; equalizing a reproduction signal from the recording medium by partial response class 1;

Viterbi decoding the equalized reproduction signal to generate a waveform string;

NRZI demodulating the Viterbi decoded waveform string to generate a code series; and transforming each 10-bit code of the NRZI demodulated code series to 8-bit data.

12. A reproducing apparatus for a recording medium comprising:

reproducing means for reproducing a signal from a recording medium loaded in the apparatus and outputting a reproducing signal;

first equalizing means for equalizing the reproduction signal from the reproducing means by partial response class 1; Viterbi decoding means for Viterbi decoding the reproduction signal equalized by the first equalizing means to reproduce a waveform string;

second equalizing means for integral equalizing the reproduction signal from the reproducing means;

binary coding means for binary coding the reproduction signal equalized by the second equalizing means to reproduce a waveform string;

switching means for selecting one of the waveform string from the Viterbi decoding means and the waveform string from the binary coding means;

NRZI demodulation means for NRZI demodulating the waveform string selected by the switching means to reproduce a code series; and control means for detecting density of the recording medium loaded in the apparatus and controlling the switching means to select the waveform string from the Viterbi decoding means when detection results show that the density of the recording medium is high, and to select the waveform string from the binary coding means when the detection results show that the density of the recording medium is low.

13. The reproducing apparatus for a recording medium as claimed in claim 12, wherein the recording medium is housed in a cartridge, the cartridge having an identification part for identifying recording density of the recording medium housed therein.

14. The reproducing apparatus for a recording medium as claimed in claim 12, wherein the recording medium is a tape-like recording medium housed in a cartridge having an identification part for showing linear recording density of the tape-like recording medium.

15. The reproducing apparatus for a recording medium as claimed in claim 12, further comprising clock reproducing means selectively supplied with the waveform string from the first or second equalizing means by the switching means and adapted for reproducing a channel clock on the basis of the supplied waveform string.

* * * * *

UNITED STATES PATENT AND TRADEMARK OFFICE
CERTIFICATE OF CORRECTION

PATENT NO. : 5,644,307
DATED : July 01, 1997
INVENTOR(S) : Shinichi Fukuda

It is certified that error appears in the above-identified patent and that said Letter Patent is hereby corrected as shown below:

```
On the title page, item [57],
```
In the Abstract, line 1, delete "is"
Col.1, line 17, after "as" delete ","
      line 34, change "82" to --62--
Col.2, line 8, after "as" delete ","
Col.3, line 31, "According" should be a new paragraph
Col.4, line 21, change "9" to --3--
      line 40, change "9" to --3--
Col.5, lines 12 & 13, change "a recording and" to --also provided--
Col.8, line 26, after "as" delete ","
      line 40, change "outputted" to --output--
      line 48, after "modulator" insert --21.--
      line 65, change "O" first occurrence, to --0's--
      line 66, change "O" to --O's--
Col.9, line 40, after "as" delete ","
      line 42, change ""AT""" to --"A7"--
      line 48, change "lowered" to --lowering--
Col.10, line 14, change ""47"" to --47--
      line 18, change "1s" to --1's--
      line 20, delete "EB," second occurrence
      line 21, delete "or" second occurrence
Col.11 line 50, "The" should be a new paragraph
Col.12, line 44, after "DDS2" delete ","
      line 61, change "Kbpi" to --kbpi--
      line 62, change "Kbps" to --kbpi--
Col.13, line 1, change "Kbpi" to --kbpi--
      line 7, change "Kbpi" to --kbpi--

UNITED STATES PATENT AND TRADEMARK OFFICE
CERTIFICATE OF CORRECTION

PATENT NO. : 5,644,307
DATED : July 01, 1997
INVENTOR(S) : Shinichi Fukuda

It is certified that error appears in the above-identified patent and that said Letters Patent is hereby corrected as shown below:

Col.16, line 43 should continue on line 42

Signed and Sealed this

Seventeenth Day of March, 1998

Attest:

BRUCE LEHMAN

Attesting Officer

Commissioner of Patents and Trademarks